United States Patent
Damjanovic et al.

(10) Patent No.: US 9,633,896 B1
(45) Date of Patent: Apr. 25, 2017

(54) METHODS FOR FORMATION OF LOW-K ALUMINUM-CONTAINING ETCH STOP FILMS

(71) Applicant: Lam Research Corporation, Fremont, CA (US)

(72) Inventors: Daniel Damjanovic, Sherwood, OR (US); Pramod Subramonium, Beaverton, OR (US); Nagraj Shankar, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/949,533

(22) Filed: Nov. 23, 2015

Related U.S. Application Data

(60) Provisional application No. 62/239,666, filed on Oct. 9, 2015.

(51) Int. Cl.
*H01L 21/768* (2006.01)
*H01L 21/02* (2006.01)
(Continued)

(52) U.S. Cl.
CPC .... *H01L 21/76831* (2013.01); *H01L 21/0228* (2013.01); *H01L 21/02178* (2013.01);
(Continued)

(58) Field of Classification Search
CPC ......... H01L 21/76831; H01L 21/02178; H01L 21/76802; H01L 21/76834;
(Continued)

(56) References Cited

U.S. PATENT DOCUMENTS

| 4,282,268 A | 8/1981 | Priestley et al. |
| 4,956,204 A | 9/1990 | Amazawa et al. |
(Continued)

FOREIGN PATENT DOCUMENTS

| CN | 1221979 A | 7/1999 |
| CN | 1691307 A | 11/2005 |
(Continued)

OTHER PUBLICATIONS

US Office Action, dated Sep. 1, 2009, issued in U.S. Appl. No. 11/709,293.
(Continued)

*Primary Examiner* — Caleen Sullivan
(74) *Attorney, Agent, or Firm* — Weaver Austin Villeneuve & Sampson LLP

(57) ABSTRACT

Dielectric AlO, AlOC, AlON and AlOCN films characterized by a dielectric constant (k) of less than about 10 and having a density of at least about 2.5 g/cm$^3$ are deposited on partially fabricated semiconductor devices to serve as etch stop layers and/or diffusion barriers. In one implementation, a substrate containing an exposed dielectric layer (e.g., a ULK dielectric) and an exposed metal layer is contacted with an aluminum-containing compound (such as trimethylaluminum) in an iALD process chamber and the aluminum-containing compound is allowed to adsorb onto the surface of the substrate. This step is performed in an absence of plasma. Next, the unadsorbed aluminum-containing compound is removed from the process chamber, and the substrate is treated with a process gas containing $CO_2$ or $N_2O$, and an inert gas in a plasma to form an AlO, AlOC, or AlON layer. These steps are then repeated.

20 Claims, 13 Drawing Sheets

(51) Int. Cl.
*H01L 21/31* (2006.01)
*H01L 21/311* (2006.01)

(52) U.S. Cl.
CPC .. *H01L 21/02274* (2013.01); *H01L 21/31116* (2013.01); *H01L 21/31144* (2013.01); *H01L 21/76802* (2013.01); *H01L 21/76834* (2013.01)

(58) Field of Classification Search
CPC ......... H01L 21/31144; H01L 21/31116; H01L 21/02274; H01L 21/0228
USPC ....................................................... 438/702
See application file for complete search history.

(56) References Cited

U.S. PATENT DOCUMENTS

| | | | |
|---|---|---|---|
| 5,447,887 | A | 9/1995 | Filipiak et al. |
| 5,975,740 | A | 11/1999 | Lin et al. |
| 6,143,657 | A | 11/2000 | Liu et al. |
| 6,153,523 | A | 11/2000 | Van Ngo et al. |
| 6,181,013 | B1 | 1/2001 | Liu et al. |
| 6,271,595 | B1 | 8/2001 | McGahay et al. |
| 6,416,822 | B1 | 7/2002 | Chiang et al. |
| 6,428,859 | B1 | 8/2002 | Chiang et al. |
| 6,518,167 | B1 | 2/2003 | You et al. |
| 6,573,604 | B1 | 6/2003 | Kajita |
| 6,599,827 | B1 | 7/2003 | Ngo et al. |
| 6,750,541 | B2 | 6/2004 | Ohtsuka et al. |
| 6,777,323 | B2 | 8/2004 | Kakamu |
| 6,821,890 | B2 | 11/2004 | McGahay et al. |
| 6,844,258 | B1 | 1/2005 | Fair et al. |
| 6,855,645 | B2 | 2/2005 | Tang et al. |
| 6,869,873 | B2 | 3/2005 | Bradshaw et al. |
| 6,974,768 | B1 | 12/2005 | Kailasam |
| 7,060,619 | B2 | 6/2006 | Cowley et al. |
| 7,179,747 | B2 | 2/2007 | Papa Rao et al. |
| 7,202,185 | B1 | 4/2007 | Hausmann et al. |
| 7,211,509 | B1 | 5/2007 | Gopinath et al. |
| 7,239,017 | B1 | 7/2007 | Yu et al. |
| 7,247,946 | B2 | 7/2007 | Bruley et al. |
| 7,250,679 | B2 | 7/2007 | Otsuka |
| 7,282,438 | B1 | 10/2007 | Yu et al. |
| 7,297,608 | B1 | 11/2007 | Papasouliotis et al. |
| 7,396,759 | B1 | 7/2008 | Van Schravendijk et al. |
| 7,402,532 | B2 | 7/2008 | Clevenger et al. |
| 7,420,275 | B1 | 9/2008 | Yu et al. |
| 7,452,743 | B2 | 11/2008 | Oliver et al. |
| 7,576,006 | B1 | 8/2009 | Yu et al. |
| 7,601,636 | B2 | 10/2009 | Dumas et al. |
| 7,648,899 | B1 | 1/2010 | Banerji et al. |
| 7,704,873 | B1 | 4/2010 | Yu et al. |
| 7,727,880 | B1 | 6/2010 | Chattopadhyay et al. |
| 7,727,881 | B1 | 6/2010 | Chattopadhyay et al. |
| 7,799,671 | B1 | 9/2010 | Banerji et al. |
| 7,825,019 | B2 | 11/2010 | Clevenger et al. |
| 7,858,510 | B1 | 12/2010 | Banerji et al. |
| 8,021,486 | B1 | 9/2011 | Yu et al. |
| 8,030,777 | B1 | 10/2011 | Van Schravendijk et al. |
| 8,268,722 | B2 | 9/2012 | Yu et al. |
| 8,317,923 | B1 | 11/2012 | Chattopadhyay et al. |
| 8,349,730 | B2 | 1/2013 | Shih et al. |
| 8,430,992 | B1 | 4/2013 | Chattopadhyay et al. |
| 8,747,964 | B2 | 6/2014 | Park et al. |
| 8,753,978 | B2 | 6/2014 | Yu et al. |
| 2001/0006701 | A1 | 7/2001 | Kobayashi et al. |
| 2002/0048926 | A1 | 4/2002 | Konecni |
| 2002/0066411 | A1 | 6/2002 | Chiang et al. |
| 2002/0074664 | A1 | 6/2002 | Nogami et al. |
| 2002/0111009 | A1 | 8/2002 | Huang et al. |
| 2002/0155702 | A1 | 10/2002 | Aoki et al. |
| 2002/0173158 | A1 | 11/2002 | Jeng |
| 2002/0192396 | A1 | 12/2002 | Wang et al. |
| 2003/0209738 | A1 | 11/2003 | Ohto et al. |
| 2003/0224599 | A1 | 12/2003 | Zistl et al. |
| 2004/0092096 | A1 | 5/2004 | Raaijmakers et al. |
| 2004/0097075 | A1 | 5/2004 | Bradshaw et al. |
| 2004/0130030 | A1 | 7/2004 | Kunimune et al. |
| 2004/0175921 | A1 | 9/2004 | Cowley et al. |
| 2004/0229454 | A1 | 11/2004 | Torres et al. |
| 2004/0238963 | A1 | 12/2004 | Fujisawa |
| 2004/0266171 | A1 | 12/2004 | Aoki et al. |
| 2005/0003662 | A1* | 1/2005 | Jursich .................. C23C 16/403 438/681 |
| 2005/0048767 | A1 | 3/2005 | Matsumoto |
| 2005/0085031 | A1 | 4/2005 | Lopatin et al. |
| 2005/0127511 | A1 | 6/2005 | Yang et al. |
| 2005/0142833 | A1 | 6/2005 | Kim |
| 2005/0230831 | A1 | 10/2005 | Clevenger et al. |
| 2005/0282378 | A1 | 12/2005 | Fukunaga et al. |
| 2006/0046479 | A1 | 3/2006 | Rajagopalan et al. |
| 2006/0160353 | A1 | 7/2006 | Gueneau de Mussy et al. |
| 2006/0166448 | A1 | 7/2006 | Cohen |
| 2006/0286764 | A1 | 12/2006 | Zhang et al. |
| 2007/0035029 | A1 | 2/2007 | Caubet et al. |
| 2007/0037388 | A1 | 2/2007 | Hohage et al. |
| 2007/0054485 | A1 | 3/2007 | Torres et al. |
| 2007/0059925 | A1 | 3/2007 | Choi et al. |
| 2007/0099417 | A1 | 5/2007 | Fang et al. |
| 2007/0105377 | A1 | 5/2007 | Koos et al. |
| 2007/0123044 | A1 | 5/2007 | Hohage et al. |
| 2007/0145600 | A1 | 6/2007 | Yano et al. |
| 2008/0121249 | A1 | 5/2008 | Gatineau et al. |
| 2008/0150137 | A1 | 6/2008 | Liu et al. |
| 2008/0233745 | A1 | 9/2008 | Chang et al. |
| 2009/0093100 | A1 | 4/2009 | Xia et al. |
| 2009/0218627 | A1 | 9/2009 | Zhu |
| 2009/0243108 | A1 | 10/2009 | Gosset et al. |
| 2009/0280643 | A1 | 11/2009 | Andry et al. |
| 2010/0090343 | A1 | 4/2010 | Chang et al. |
| 2010/0164074 | A1 | 7/2010 | King |
| 2010/0308463 | A1 | 12/2010 | Yu et al. |
| 2013/0143406 | A1 | 6/2013 | Hsu et al. |
| 2013/0323930 | A1 | 12/2013 | Chattopadhyay et al. |
| 2014/0017414 | A1* | 1/2014 | Fukazawa ............. C23C 16/403 427/576 |
| 2014/0216336 | A1 | 8/2014 | Yu et al. |
| 2015/0028483 | A1 | 1/2015 | Zhou |

FOREIGN PATENT DOCUMENTS

| | | |
|---|---|---|
| CN | 1691323 A | 11/2005 |
| CN | 102130046 | 7/2011 |
| EP | 2259303 | 12/2010 |
| JP | 56157037 | 12/1981 |
| JP | S63-282274 | 11/1988 |
| JP | 09082696 A | 3/1997 |
| JP | 2000-252278 | 9/2000 |
| JP | 2001-524754 | 12/2001 |
| JP | 2002-164351 | 6/2002 |
| JP | 2009-517859 | 4/2009 |
| TW | 486482 | 5/2002 |
| TW | 518707 | 1/2003 |
| TW | 200837882 | 9/2008 |
| TW | 200941644 | 10/2009 |
| TW | 201117321 | 5/2011 |
| TW | 201138024 | 11/2011 |
| WO | WO 99/27580 | 6/1999 |
| WO | WO 2007/060640 | 5/2007 |
| WO | WO 2008/094669 | 8/2008 |
| WO | WO 2012/167141 | 12/2012 |

OTHER PUBLICATIONS

US Notice of Allowance, dated Jan. 29, 2010, issued in U.S. Appl. No. 11/709,293.
US Office Action, dated Jun. 28, 2012, issued in U.S. Appl. No. 12/763,545.
US Notice of Allowance, dated Jan. 3, 2013, issued in U.S. Appl. No. 12/763,545.
US Office Action, dated Sep. 4, 2009, issued in U.S. Appl. No. 11/709,294.

(56) References Cited

OTHER PUBLICATIONS

US Notice of Allowance, dated Feb. 22, 2010, issued in U.S. Appl. No. 11/709,294.
US Office Action, dated Mar. 15, 2012, issued in U.S. Appl. No. 12/762,223.
US Notice of Allowance, dated Aug. 3, 2012, issued in U.S. Appl. No. 12/762,223.
US Office Action, dated Aug. 21, 2008, issued in U.S. Appl. No. 11/888,323.
US Notice of Allowance, dated Jun. 17, 2009, issued in U.S. Appl. No. 11/888,323.
US Notice of Allowance, dated Dec. 15, 2009, issued in U.S. Appl. No. 11/726,363.
US Office Action, dated Dec. 3, 2010, issued in U.S. Appl. No. 12/693,645.
US Notice of Allowance, dated May 18, 2011, issued in U.S. Appl. No. 12/693,645.
US Office Action, dated Apr. 2, 2009, issued in U.S. Appl. No. 12/074,108.
US Notice of Allowance, dated Sep. 4, 2009, issued in U.S. Appl. No. 12/074,108.
US Notice of Allowance, dated Jun. 28, 2010, issued in U.S. Appl. No. 12/630,457.
US Notice of Allowance, dated Aug. 12, 2010, issued in U.S. Appl. No. 12/689,803.
US Office Action, dated Feb. 8, 2012, issued in U.S. Appl. No. 12/688,154.
US Notice of Allowance, dated May 29, 2012, issued in U.S. Appl. No. 12/688,154.
US Office Action, dated Jun. 13, 2007, issued in U.S. Appl. No. 10/980,076.
US Office Action, dated Nov. 28, 2007, issued in U.S. Appl. No. 10/980,076.
US Notice of Allowance, dated Mar. 11, 2008, issued in U.S. Appl. No. 10/980,076.
US Office Action, dated Dec. 12, 2008, issued in U.S. Appl. No. 11/671,161.
US Final Office Action, dated Jun. 17, 2009, issued in U.S. Appl. No. 11/671,161.
US Office Action, dated Oct. 29, 2009, issued in U.S. Appl. No. 11/671,161.
US Final Office Action, dated Feb. 19, 2010, issued in U.S. Appl. No. 11/671,161.
US Office Action, dated Aug. 17, 2010, issued in U.S. Appl. No. 11/671,161.
US Final Office Action, dated Dec. 6, 2010, issued in U.S. Appl. No. 11/671,161.
US Notice of Allowance, dated May 31, 2011, issued in U.S. Appl. No. 11/671,161.
US Notice of Allowance, dated Feb. 6, 2014, issued in U.S. Appl. No. 13/486,272.
US Office Action, dated Dec. 9, 2013, issued in U.S. Appl. No. 13/482,786.
US Final Office Action, dated Aug. 1, 2014, issued in U.S. Appl. No. 13/482,786.
Chinese First Office Action, dated Feb. 8, 2014, issued in CN 2011010021170.4.
Japanese Office Action dated Oct. 28, 2014 issued in JP 2011-004797.
Taiwan First Office Action dated May 28, 2015 issued in TW 100101507.
European Extended Search Report, dated Oct. 29, 2012, issued in EP10 164 594.3.
Taiwan First Office Action dated Oct. 18, 2013 issued in TW 099117806.
PCT International Search Report and Written Opinion, dated Dec. 26, 2012, issued in PCT/US2012/040542.
PCT International Preliminary Report on Patentability and Written Opinion, dated Dec. 19, 2013, issued in PCT/US2012/040542.
Chinese First Office Action, dated Jul. 1, 2015, issued in CN 201280027241.4.
Abe et al. (2005) "A Robust 45 nm-node, Dual Damascene Interconnects with High Quality Cu/barrier Interface by a Novel Oxygen Absorption Process", *IEEE, NEC Corporation and NEC Electronics*, Japan, 4 pages.
Cheng et al. (Dec. 6, 2003) "Effect of Trimethylsilane Flow Rate on the Growth of SiC Thin-Films for Fiber-Optic Temperature Sensors", *Journal of Microelectromechanical Systems*, 12(6):797-803.
Lee et al. (2004) "High Performance Cu interconnects capped with Full-Coverage ALD TaNx layer for Cu/Low-k (k-2.5) Metallization", *IEEE, Taiwan Semiconductor Manufacturing Company, Ltd.* pp. 72-74.
Mori et al. (2006) "Reliability Improvement and its Mechanism for Cu Interconnects with Cu-Al Alloy Seeds", *Renesas Technology Corp.*, Japan, pp. 77 & 78.
Product Safety Assessment, SiLK™ Semiconductor Dielectric Resins, *The Dow Chemical Company*, Created Sep. 25, 2009, 6 pages.
Quirk, (2001) "Chemical Mechanical Planarization", *Semiconductor Manufacturing Technology, Prentice Hall*, Chapter 13, pp. 522-527.
Ueno et al. (Jun. 6-8, 1995) "A Half-Micron Pitch Cu Interconnection Technology," *Symposium on VLSI Technology, Digest of Technical Papers*, (IEEE Cat. No. 95CH35781) *Japan Soc. Appl. Phys.* Tokyo, Japan, pp. 27-28 XP002685158.
Yokogawa et al. (2007) "Analytical Study of Impurity Doping Effects on Electromigration of Cu Interconnects by Employing Comprehensive Scattering Model", *IEEE 07CH37867, 45th Annual International Reliability Physics Symposium*, Phoenix, NEC Electronics Corporation, Japan, pp. 117-121.
US Office Action, dated Aug. 22, 2016, issued in U.S. Appl. No. 14/244,808.
US Office Action, dated Nov. 19, 2015, issued in U.S. Appl. No. 13/482,786.
US Final Office Action, dated Mar. 2, 2016, issued in U.S. Appl. No. 13/482,786.
US Office Action, dated Jun. 24, 2016, issued in U.S. Appl. No. 13/482,786.
Taiwan Decision of Rejection dated Jan. 21, 2016 issued in TW 100101507.
Chinese Second Office Action, dated May 5, 2016, issued in CN 201280027241.4.
Taiwan Office Action and Search Report dated Nov. 12, 2015 issued in TW 101119851.

* cited by examiner

METHODS FOR FORMATION OF LOW-K ALUMINUM-CONTAINING ETCH STOP FILMS

CROSS-REFERENCE TO RELATED APPLICATIONS

This application claims benefit under 35 U.S.C. §119(e) to U.S. Provisional Patent Application No. 62/239,666, filed Oct. 9, 2015, which is herein incorporated by reference in its entirety.

FIELD OF THE INVENTION

This invention pertains to methods of depositing dielectric films in semiconductor device manufacturing. Specifically, this invention pertains to methods of depositing low-k dielectric etch stop layers over inter-layer dielectric (ILD) during integrated circuit (IC) fabrication.

BACKGROUND

In integrated circuit fabrication, metal lines (such as copper lines) are typically embedded in ILD layers, where the ILD is often a porous silicon oxide based dielectric material or an organic polymeric dielectric material having a low dielectric constant, such as an ultra-low-k (ULK) dielectric with a dielectric constant of 2.2 or less. Formation of such embedded metal lines via a Damascene process requires patterning and etching of the ILD to form vias and trenches, followed by filling of these vias and trenches with a metal (e.g., copper), for example, using electroplating. After the vias and trenches are filled with a metal, a second layer of ILD is deposited and is again patterned to form vias and trenches. These recessed features are again filled with a metal, such that a stack of ILD layers having embedded metal lines is formed, where the metal lines form the conductive paths of an integrated circuit. Etch stop layers are often deposited over individual ILD layers and metal lines, and are used in patterning operations of the IC fabrication process to protect the material residing underneath these layers from being etched during patterning. For example, the semiconductor substrate may include an etch stop layer residing between two ILD layers. When the top ILD layer is patterned and etched (e.g., with a fluoride-based chemistry) to define vias and trenches, the etch stop layer protects the bottom ILD layer underneath the etch stop from being etched.

The material of the etch stop layer should exhibit good etch selectivity versus the material that is being etched. In other words, the etch stop layer material should be etched at a significantly lower rate than the exposed ILD material (or other material that is being patterned).

Etch stop layers typically are not completely removed during the integrated circuit fabrication, and remain in the final manufactured semiconductor device as thin films between thicker ILD layers. Examples of conventionally used etch stop layer materials include silicon carbide and silicon nitride.

SUMMARY

Methods, apparatus, and systems for forming low-k dielectric AlO, AlOC, AlON, and AlOCN materials are provided. Provided materials are highly suitable for use as etch stop layers, since they are characterized by low dielectric constants (k) and relatively high densities. Low dielectric constants are highly desirable for etch stop layers because etch stop layers are not completely removed from the semiconductor device during processing, and the final device usually contains thin etch stop layers between the individual ILD layers. In order to minimize cross-talk between metal lines and to reduce the resistance-capacitance (RC) delay, it is important to use etch stop materials with low dielectric constants. However, many conventional low-k materials often have relatively low etch selectivity versus the ILD material. Therefore, materials with low dielectric constants and high etch selectivity are needed. Etch selectivity is the property that positively correlates with material density. Therefore, materials that concurrently possess low dielectric constant and high density are desired.

The AlO, AlOC AlON, and AlOCN materials provided herein are characterized by dielectric constants of less than about 10, such as between about 4-10, and densities of greater than about 2.5 $g/cm^3$, such as between about 2.5-3.5 $g/cm^3$ (e.g., between about 2.6-3.2 $g/cm^3$). Furthermore, AlO and AlOC films with dielectric constants of less than about 8, such as between about 5-8, and densities of greater than about 2.5 $g/cm^3$, such as between about 2.8-3.2 $g/cm^3$ are provided. In some embodiments AlOC films with a dielectric constant of less than about 6.5, and a density of greater than about 2.7 $g/cm^3$ are provided. In some implementations AlOC films with a dielectric constant of less than about 5, and a density of greater than about 2.8 $g/cm^3$ are formed.

According to one aspect, a method for forming a semiconductor device structure is provided. The method can be implemented in any apparatus that is configured for generation of plasma, and for introduction of process gases into a process chamber. Examples of suitable apparatuses include ion induced atomic layer deposition (iALD) apparatus, and plasma enhanced chemical vapor deposition apparatus (PECVD). In one embodiment the method includes: (a) in a process chamber (e.g., in an iALD chamber) contacting a semiconductor substrate with an aluminum-containing compound (e.g., an organoaluminum compound, such as trimethylaluminum) and adsorbing the aluminum-containing compound onto the semiconductor substrate; (b) removing the unadsorbed aluminum-containing compound from the process chamber (e.g., using purging and/or evacuation of the process chamber); (c) modifying the adsorbed aluminum-containing compound to form a dielectric compound selected from the group consisting of AlO, AlOC, AlON, and AlOCN by contacting the semiconductor substrate in the process chamber with an oxidizing plasma; (d) purging and/or evacuating the process chamber; and (e) repeating operations (a)-(d) to form a dielectric film, wherein the formed dielectric film is characterized by a dielectric constant of less than about 10, and a density of at least about 2.5 $g/cm^3$. In some embodiments, operations (a)-(e) are performed 10-40 times to form a layer having a thickness of between about 10-100 Å.

The oxidizing plasma can be formed in a process gas comprising an oxygen-containing gas, such as $N_2O$, $CO_2$, $O_2$, CO, NO and mixtures thereof. The process gas in some embodiments further includes an inert gas, such as helium or argon. In some embodiments, the oxygen-containing gas can be provided in a mixture with $N_2$ (e.g., a mixture of $O_2$ and $N_2$). In one of the preferred embodiments the oxidizing plasma is formed in a process gas comprising an inert gas and an oxidizer selected from the group consisting of $CO_2$, $N_2O$ and mixtures thereof. The type of the oxygen-containing gas and its concentration in the process gas can be used to tune the deposition rate of the film, the composition if the film, as well as dielectric constant and other properties of provided AlO, AlOC, AlON, and AlOCN films.

In some embodiments, the method involves adsorbing trimethylaluminum (TMA) as the aluminum-containing compound in (a), and modifying the adsorbed TMA with a plasma formed in the process gas comprising argon and $CO_2$. It was unexpectedly discovered that AlOC films with a relatively high carbon content (5% or more) are formed by such method, and that these films have an unusually low dielectric constant. For example, in some embodiments, AlOC films formed by this method have a dielectric constant of less than about 6.5, while still having a relatively high density of greater than about 2.7.

According to another aspect, an apparatus configured for depositing such films is provided. In one embodiment the apparatus includes a process chamber having a support for holding the semiconductor substrate and a controller. The controller includes program instructions for conducting any of the deposition methods provided herein. In some embodiments, the controller is programmed for: (a) introducing an aluminum-containing compound (e.g., an organoaluminum compound, such as trimethylaluminum) to the process chamber housing the semiconductor substrate and adsorbing the aluminum-containing compound onto the semiconductor substrate; (b) removing the unadsorbed aluminum-containing compound from the process chamber (e.g., using purging and/or evacuation of the process chamber); (c) modifying the adsorbed aluminum-containing compound to form a dielectric compound selected from the group consisting of AlO, AlOC, AlON by contacting the semiconductor substrate in the process chamber with an oxidizing plasma (e.g., plasma formed in a process gas comprising an inert gas (e.g., argon and/or helium) and an oxidizer selected from the group consisting of $CO_2$, $N_2O$ and mixtures thereof); (d) purging and/or evacuating the process chamber; and (e) repeating operations (a)-(d) to form a dielectric film, wherein the formed dielectric film is characterized by a dielectric constant of less than about 10, and a density of at least about 2.5 g/cm³. In some embodiments the apparatus is an iALD apparatus.

According to another aspect, a system is provided herein which includes the deposition apparatus for depositing low-k AlO, AlOC, AlON, AlOCN layers and a stepper.

According to another implementation, a non-transitory computer machine-readable medium is provided. It includes program instructions for control of a deposition apparatus. The instructions include code for deposition methods provided herein. In some embodiments code is provided for: (a) introducing an aluminum-containing compound (e.g., an organoaluminum compound, such as trimethylaluminum) to the process chamber housing the semiconductor substrate and adsorbing the aluminum-containing compound onto the semiconductor substrate; (b) removing the unadsorbed aluminum-containing compound from the process chamber (e.g., using purging and/or evacuation of the process chamber); (c) modifying the adsorbed aluminum-containing compound to form a dielectric compound selected from the group consisting of AlO, AlOC, AlON, and AlOCN by contacting the semiconductor substrate in the process chamber with an oxidizing plasma (e.g., plasma formed in a process gas comprising an inert gas such as argon and/or helium, and an oxidizer selected from the group consisting of $CO_2$, $N_2O$ and mixtures thereof; (d) purging and/or evacuating the process chamber; and (e) repeating operations (a)-(d) to form a dielectric film, wherein the formed dielectric film is characterized by a dielectric constant of less than about 10, and a density of at least about 2.5 g/cm³.

According to another aspect a semiconductor device comprising a dielectric aluminum-containing layer selected from the group consisting of AlO, AlOC, AlON, and AlOCN, is provided, wherein the dielectric layer is characterized by a dielectric constant of less than about 10, and a density of at least about 2.5 g/cm³.

These and other features and advantages of the present invention will be described in more detail below with reference to the associated drawings.

DETAILED DESCRIPTION

Figure 1A:
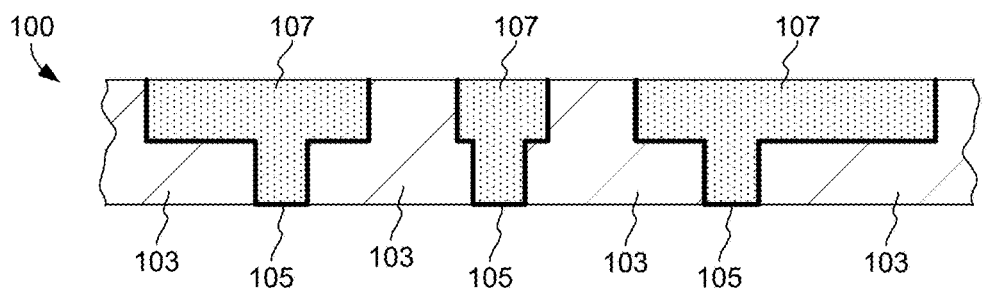
FIGS. 1A-1C show cross-sectional views of a semiconductor device during processing illustrating etch stop films according to an embodiment provided herein.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this description, the terms "semiconductor wafer," "semiconductor substrate", "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like. The term "semiconductor wafer" or "semiconductor substrate" used herein refers to a substrate that has semiconductor material anywhere within its body, and it is understood that the semiconductor material does not need to be exposed. In many embodiments the semiconductor substrate includes one or more dielectric and conductive layers formed over the semiconductor material.

The AlO films provided herein contain aluminum, oxygen, and may also contain hydrogen. Other elements may be present only in small amounts (less than about 5% atomic for the sum of other elements). The AlOC films provided herein contain aluminum, oxygen, and carbon, and may also contain hydrogen. Other elements may be present only in small amounts (less than about 5% atomic for the sum of other elements). The stoichiometry of the AlO and AlOC films may vary. In some embodiments, the aluminum content in AlO films is between about 20-40 atomic %; oxygen content is between about 55-65 atomic %; and hydrogen content is between about 0-8% (e.g., between about 1-5 atomic %). In some embodiments, the aluminum content in AlOC films is between about 20-40 atomic %; oxygen content is between about 55-65 atomic %; carbon content is between about 1-15% atomic (such as between about 5-10% atomic) and hydrogen content is between about 0-8% (e.g., between about 1-5 atomic %). In some embodiments the films contain small amounts of trapped argon. The carbon in the films may form Al—C bonds and/or C═O (carbonyl) bonds. In various embodiments the infra-red spectra of AlOC films contain peaks at about 870 $cm^{-1}$ (corresponding to Al—C stretch) and/or peaks at about 1470 $cm^{-1}$ and 1560 $cm^{-1}$ (both corresponding to a carbonyl stretch).

The AlON films provided herein contain aluminum, oxygen, and nitrogen, and may also contain hydrogen. Other elements may be present only in small amounts (less than about 5% atomic for the sum of other elements). The stoichiometry of AlON films may vary. The AlOCN films provided herein contain aluminum, oxygen, carbon, and nitrogen, and may also contain hydrogen. Other elements may be present only in small amounts (less than about 5% atomic for the sum of other elements). The stoichiometry of AlOCN films may vary.

In some embodiments a semiconductor device is provided, where the semiconductor device includes two layers of ILD (e.g., a ULK dielectric) and a thin layer of provided AlO, AlOC, AlON, or AlOCN film (e.g., between about 10-100 Å, such as about 20 Å), residing between the two ILD layers. The ILD layers may also include embedded metal (e.g., copper) lines, and, in some embodiments, the thin layer of AlO, AlOC, AlON, or AlOCN also resides between metal and ILD (e.g., ULK dielectric). In some embodiments, provided layers are also used as diffusion barrier layers residing at the interface between copper and ULK dielectric and preventing the diffusion of copper into dielectric.

The AlO, AlOC, AlON, and AlOCN materials provided herein are characterized by dielectric constants of less than about 10, such as between about 4-10, and densities of greater than about 2.5 $g/cm^3$, such as between about 2.5-3.5 $g/cm^3$ (e.g., between about 2.6-3.2 $g/cm^3$). Furthermore, AlO and AlOC films with dielectric constants of less than about 8, such as between about 5-8, and densities of greater than about 2.5 $g/cm^3$, such as between about 2.8-3.2 $g/cm^3$ are provided. In some embodiments AlOC films with a dielectric constant of less than about 6.5, and a density of greater than about 2.7 $g/cm^3$ are provided. In some examples AlOC films with a dielectric constant of less than about 5, and a density of greater than about 2.8 $g/cm^3$ are provided.

In some embodiments provided films are also characterized by scalable dielectric constant, that is, a dielectric constant that is substantially independent of the thickness of the film. For example, in provided AlO and AlOC films the dielectric constant for a 100 Å thick film and a 20 Å thick film are substantially the same. It is noted that in an AlN film (a comparative film) the dielectric constant does not scale well with thickness and is greater for thinner films (e.g., 10-20 Å) in comparison with thicker films (e.g., 50-100 Å).

Generally, provided films can be deposited on a planar or on a patterned substrate. In one embodiment, provided films are deposited on a semiconductor substrate having an exposed planar layer of dielectric. In another embodiment, provided films are deposited on a planarized semiconductor substrate having an exposed layer of dielectric and an exposed layer of metal (such as copper). It is noted that when the provided dielectric aluminum-containing films are deposited on a substrate having an exposed dielectric layer and a metal (e.g., copper) layer, the thickness of deposited AlO, AlOC, AlON or AlOCN film on a metal would often be greater than on a dielectric. In some embodiments the thickness of the deposited aluminum-containing layer on the metal is at least about 50% greater, such as at least 100% greater than the thickness of this layer on the dielectric. For example, in some embodiments, the deposition may result in a 20 Å thick layer over dielectric and a 40 Å thick layer over copper. This is due to improved, faster nucleation and improved adsorption of an aluminum-containing precursor compound (e.g., TMA) on copper relative to low-k dielectric. When the aluminum-containing precursor compound is deposited onto the porous ULK material, some of that precursor may diffuse into the top portion of the ULK layer before the film is allowed to be formed in the ALD cycles, leading to a generally smaller thickness of the film on the dielectric in comparison with copper. This thickness difference is particularly desirable, when the aluminum-containing dielectric film is used as a copper diffusion barrier layer. In some embodiments all or most of the aluminum-containing dielectric layer (e.g., 50% or more) deposited over the ILD is etched out, while a portion of a thicker aluminum-containing dielectric layer remains over copper, allowing this layer to serve as a copper diffusion barrier layer.

In some embodiments, the provided films are deposited on a substrate having a plurality of recessed features, such as trenches and vias. For example, provided films can be deposited on a substrate having an exposed dielectric with a plurality of recessed features formed in such dielectric. It was determined that provided films, when deposited in an iALD apparatus, can be conformally deposited onto such patterned substrates with good step coverage. In some embodiments, the recessed features on patterned substrates have widths of between about 10-80 nm.

Provided films can be used in any application where a combination of low dielectric constant (such as less than about 10, e.g., between about 4-8) and relatively high density (e.g., greater than about 2.5 $g/cm^3$) such as between about 2.8-3.5 g/cm$^3$) is desired. For example, provided films can be used as etch stop layers, copper diffusion barrier layers, and, in some embodiments, may serve a dual purpose of etch stops and diffusion barriers.

Figure 1B:
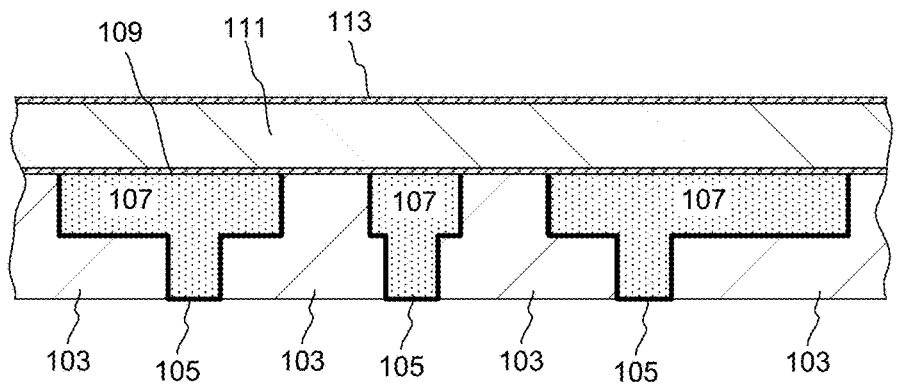
Figure 1C:
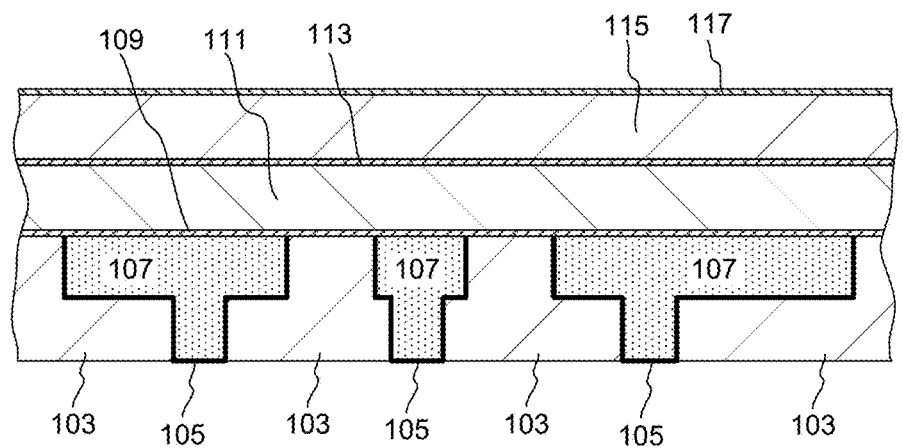

FIGS. 1A-1C provide an example of a semiconductor substrate undergoing several steps of dual Damascene processing, where deposition of provided AlO, AlOC, AlON, and AlOCN films is illustrated. Referring to FIG. 1A, an example of a partially fabricated IC structure, 100, used for dual Damascene fabrication is illustrated. Structure 100, as shown in FIGS. 1A-1C, is part of a semiconductor substrate, and, in some embodiments, may directly reside on a layer containing active devices, such as transistors. In other embodiments, it may directly reside on a metallization layer or on other layers that incorporate conductive materials, e.g., layers containing memory capacitors.

A layer 103 illustrated in FIG. 1A is a layer of inter-layer dielectric, which may be silicon dioxide but is more typically a low-k dielectric material. In order to minimize the dielectric constant of the inter-metal dielectric stack, materials with a k value of less than about 3.5, preferably less than about 3.0 and often lower than about 2.8 are employed as inter layer dielectrics. These materials include but are not limited to fluorine or carbon doped silicon dioxide, organic-containing low-k materials and porous doped silicon dioxide materials known to those of skill in the art. Such materials can be deposited, for example, by PECVD or by spin-on methods. Layer 103 is etched with line paths (trenches and vias) in which a partially conductive metal diffusion barrier 105 is deposited, followed by inlaying with copper conductive routes 107. Because copper or other mobile conductive material provides the conductive paths of the semiconductor substrate, the underlying silicon devices and dielectric layers proximate to metal lines must be protected from metal ions (e.g., Cu$^{2+}$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers which will be described in further detail with reference to FIG. 1B. Suitable materials for partially conductive diffusion barrier 105 include materials, such as tantalum, tantalum nitride, titanium, titanium nitride and the like. These are typically deposited onto a dielectric layer having vias and trenches by a PVD or an ALD method.

Copper conductive routes 107 can be formed by a number of techniques, including PVD, electroplating, electroless deposition, CVD, etc. In some implementations, a preferred method of forming a copper fill includes depositing a thin seed layer of copper by PVD and subsequently depositing bulk copper fill by electroplating. Since copper is typically deposited with overburden residing in the field region, a chemical mechanical polishing (CMP) operation is needed to remove the overburden and to obtain a planarized structure 100.

Next, referring to FIG. 1B, after the structure 100 has been completed, the dielectric aluminum-containing etch stop film 109 (AlO, AlOC, AlON or AlOCN) is deposited by iALD both onto copper lines 107 and onto dielectric 103, using methods provided herein. It is noted that in some embodiments the top portion of the ILD layer 103, onto which the layer 109 is deposited, may be different from the bulk of that layer. For example, in some embodiments, the top portion of layer 103 is more mechanically robust than the bulk. In one implementation the top portion of layer 103 is a mechanically robust doped or undoped silicon-carbide or silicon nitride, while the bulk of the dielectric layer 103 is a more delicate ULK dielectric (e.g., a porous material). In one example the top portion of layer 103 is oxygen-doped silicon carbide (ODC). Presence of such more robust layer makes it easier to deposit AlO, AlOC, AlON and AlOCN films using plasma steps, without damaging the exposed portions of the substrate.

In some embodiments, the etch stop layer 109 further serves as a dielectric diffusion barrier layer, as it resides at an interface between copper and dielectric in the fabricated structure. In some embodiments, a separate diffusion barrier (or etch stop) layer is deposited on top of the layer 109. Typically, such diffusion barrier layer includes doped or undoped silicon carbide or silicon nitride.

Referring to FIG. 1B, a first dielectric layer, 111, of a dual Damascene dielectric structure is deposited onto the film 109. This is followed by deposition of an etch stop film 113 on the first dielectric layer 111. The etch stop film 113 may be one of the AlO, AlOC, AlON, and AlOCN films provided herein, deposited by an iALD method. The dielectric layer 111 is typically composed of low-k dielectric materials such as those listed for a dielectric layer 103, and may also include a more mechanically robust top portion (e.g., a top portion composed of ODC). Note that layers 111 and 103 need not necessarily have identical composition.

The process follows, as depicted in FIG. 1C, where a second dielectric layer 115 of the dual Damascene dielectric structure is deposited in a similar manner to the first dielectric layer 111, onto an etch-stop film 113. Deposition of an antireflective layer (not shown) and a CMP stop film 117 follows. Second dielectric layer 115 typically contains a low-k dielectric material such as those described above for layers 103 and 111, and may optionally include a more mechanically robust top portion. A CMP stop film 117 serves to protect the delicate dielectric material of inter-layer dielectric (IMD) layer 115 during subsequent CMP operations. Typically, a CMP stop layer is subject to similar integration requirements as a diffusion barrier and etch stop films 109 and 113, and can include AlO, AlOC, AlON, and AlOCN materials provided herein. Alternatively, it may contain a conventional CMP stop material based on silicon carbide or silicon nitride.

During subsequent operations, ILD layers 111 and 115 are patterned to form recessed features (vias and trenches). Patterning is usually performed using conventional photolithographic techniques, and involves applying photoresist to the substrate, exposing the photoresist to light, patterning the photoresist and transferring the pattern to the substrate by etching the dielectric material typically using a fluoride-based chemistry, and removing the photoresist. Provided AlO, AlOC, AlON, and AlOCN etch stop layers have good etch selectivity versus the ILD dielectric (e.g., ULK dielectric and/or ODC), and protect the material that resides below the etch stop layers from being etched.

It is noted that the provided AlO, AlOC, AlON, and AlOCN films can be used in a variety of different integration schemes, and their use is not limited to the scheme illustrated in FIGS. 1A-1C.

Figure 2:
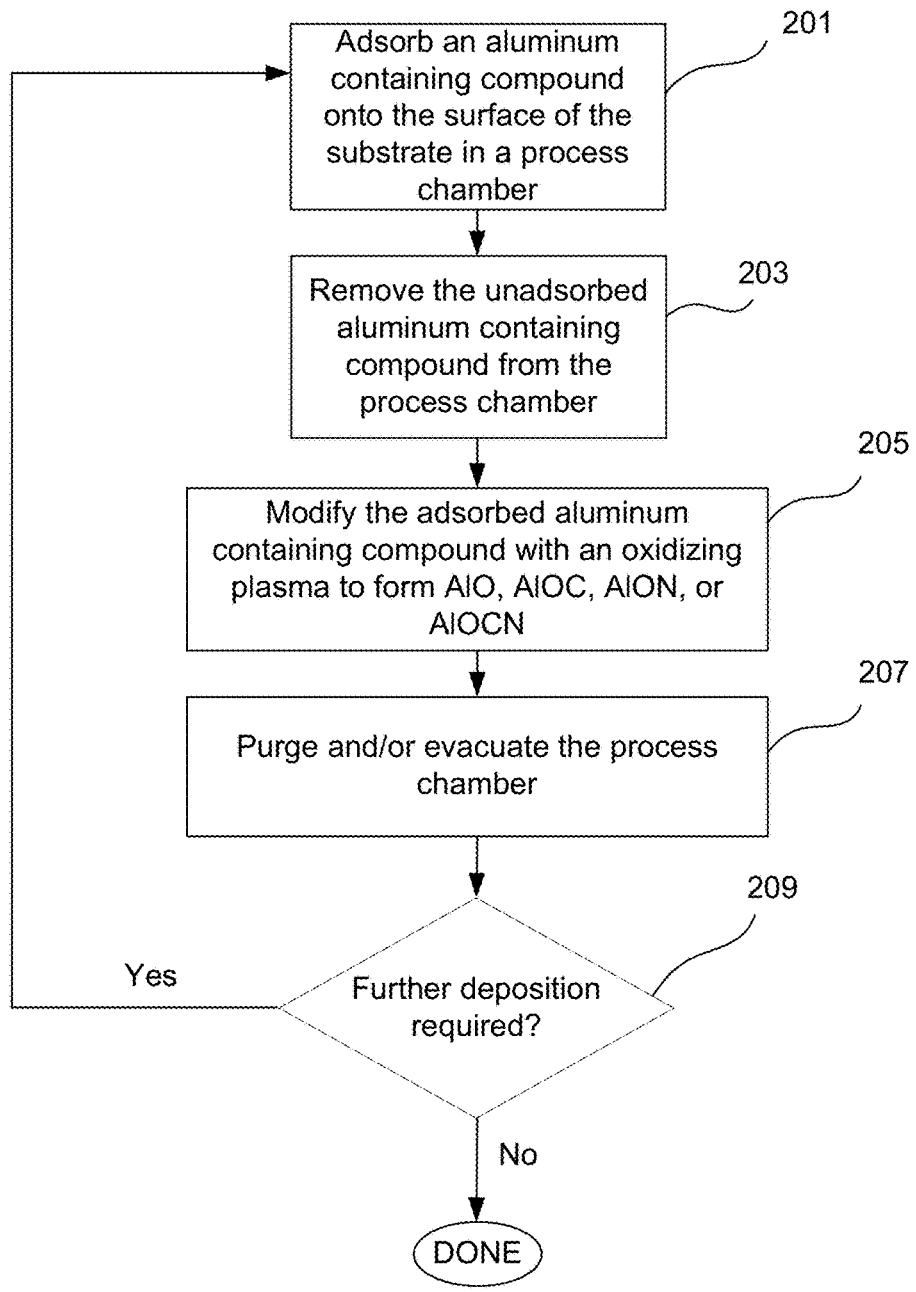
FIG. 2 is a process flow diagram for a method of depositing dielectric aluminum-containing films according to an embodiment provided herein.

In one aspect a method for depositing AlO, AlOC, AlON, and AlOCN films characterized by a dielectric constant of less than 10 and density of greater than 2.5 g/cm$^3$ is provided. This method is illustrated by the process flow diagram shown in FIG. 2. The process starts in 201 by adsorbing an aluminum-containing compound onto a surface of a substrate in a process chamber. For example, the substrate (such as a semiconductor substrate having an exposed dielectric layer) may reside in an iALD process chamber, into which an aluminum-containing compound is flowed in a vaporized form. Suitable volatile aluminum-containing compounds for this step include but are not limited to organoaluminum compounds, such as trimethylaluminum (TMA), dimethylaluminum hydride, triethylaluminum, triisobutylaluminum, and tris(diethylamino)aluminum. In many embodiments TMA is the preferred compound. The aluminum-containing compound can be introduced into the process chamber as a mixture with a carrier gas, such as $N_2$. In one example, the TMA/$N_2$ mixture is delivered to the process chamber at a flow rate of between about 100-2,000 sccm. The process conditions during the adsorption step are selected such as to avoid CVD-type deposition from the bulk of the aluminum-containing compound. Suitable process conditions for the adsorption step (e.g., TMA adsorption step) in one implementation include maintaining the process temperature in a range of between about 300-420° C., such as between about 300-400° C. (where the temperature refers to a temperature at the wafer pedestal), and maintaining a pressure of between about 1-10 Torr, such as between about 1-6 Torr in the process chamber. The substrate is contacted with the aluminum-containing compound in some embodiments for between about 0.2-60 seconds. This step is performed in the absence of plasma and is driven by the interaction between the surface of the substrate and the gaseous aluminum-containing compound. The interaction typically results in physisorption, although is some cases chemical interaction between the aluminum-containing compound and the surface of the substrate is not ruled out. As a result of this surface-limited interaction, a thin conformal adsorbed layer of aluminum-containing compound is formed on the surface. When the substrate onto which the aluminum-containing compound is adsorbed contains an exposed layer of metal, the substrate should be pre-cleaned prior to contact with the aluminum-containing compound to remove any metal oxide that may be present on the metal layer. For example, in some embodiments, a substrate containing an exposed ULK layer and an exposed copper layer is pre-cleaned with a plasma formed in a process gas comprising ammonia in order to remove copper oxide from the surface of copper. This is important to do, because in the absence of pre-clean, the aluminum-containing compound may react with copper oxide, which is not desirable in this process.

Next, in 203, the unadsorbed aluminum-containing compound is removed from the process chamber. For example, the process chamber may be purged with an inert gas, such as He or $N_2$ for between about 0.5-60 seconds. Alternatively or in addition to purging the process chamber may be evacuated to remove the unadsorbed aluminum-containing compound. When $N_2$ is used as the purging gas, and the target film is an AlO or an AlOC film, $N_2$ is removed from the chamber by pumping. The purpose of step 203 is not to allow CVD-type bulk deposition of aluminum-containing species in a subsequent step.

After removal of the unadsorbed aluminum-containing compound from the process chamber, the adsorbed aluminum-containing compound on the surface of the substrate is modified in an oxidizing plasma to form AlO, AlOC, AlON, or AlOCN in operation 205. This step is referred to as "conversion". The plasma may be generated within the process chamber where the substrate resides or remotely in a different chamber that is connected with the process chamber, where the apparatus is configured to deliver the remotely generated ions and/or radicals to the process chamber. The plasma is formed in a process gas comprising an oxidizer and an inert gas. Examples of suitable oxidizers include oxygen-containing gases, such as $CO_2$, $N_2O$, $O_2$, NO, CO, and any combination thereof. The deposited film will contain aluminum and oxygen and may further include nitrogen (when the process gas contains sources of nitrogen, such as NO, $N_2O$, or $N_2$) and/or carbon (when the process gas contains sources of carbon, such as $CO_2$, or CO). The deposition rate of the film, the composition of the film and properties of the film (such as dielectric constant and density) can be tuned by modulating the composition of the oxidizing plasma, and by modulating the concentration of the oxidizer in the process gas.

In preferred embodiments the oxidizer is $CO_2$, $N_2O$ or combinations thereof and the inert gas is a noble gas, such as helium or argon, although in some embodiments $N_2$ may also be used as the inert gas. When $CO_2$ is used as an oxidizing species, an AlOC, or an AlO film can be formed. When $N_2O$ is used as an oxidizing species, AlO films or AlON films can be formed. When a combination of $CO_2$ and $N_2O$ are used, an AlO, AlOC, AlON, or and AlOCN film may form. The plasma conversion step is performed in some examples at temperature of between about 300-420° C., such as between about 300-400° C. (where the temperature refers to a temperature at the wafer pedestal), and at a pressure of between about 1-10 Torr, such as between about 1-6 Torr. The temperature and pressure used in the conversion step may be the same or different as the temperature and pressure used during the adsorption step 201. In one implementation, the process gas consisting essentially of an oxidizing gas and an inert gas is flowed into the process chamber housing four 300 mm wafers. In some implementations the $CO_2$ or $N_2O$ is flowed at a flow rate of between about 100-20,000 sccm, such as 100-10,000 sccm, and the inert gas (e.g., helium, argon, or a mixture thereof) is flowed at a flow rate of between about 100-20,000 sccm, such as at between about 1000-10,000 sccm. Plasma can be generated using a radio frequency (RF) generator. Radio Frequency (RF) plasma may be formed using either high frequency (HF) or dual frequency generation, where dual frequency includes both low frequency (LF) and HF generation. Example low-frequency RF frequencies may include, but are not limited to, frequencies between 50 kHz and 900 kHz. Example high-frequency RF frequencies may include, but are not limited to, frequencies between 1.8 MHz and 2.45 GHz. In one embodiment, the high frequency is 13.56 MHz, and the low frequency is 400 kHz. In various embodiments the LF power ranges from about 100 to 2000 W per process module containing four 300 mm wafers, and the HF power ranges from about 400 to about 3000 W for the same process module, corresponding to HF power density of between about 0.14-1.1 W/cm$^2$, and LF power density of between about 0.03-0.71 W/cm$^2$. In various embodiments the substrate is treated with plasma in the conversion step for about 0.2-60 seconds.

Next, after the adsorbed aluminum-containing compound has been converted to AlO, AlOC AlON or AlOCN, the process chamber is purged and/or evacuated in operation 307. For example, the process chamber may be purged with an inert gas such as $N_2$ for between about 0.5-60 seconds.

Because the amount of deposited material is limited by the amount of adsorbed aluminum-containing compound in step 201, the average thickness of the layer formed in operations 201-209 is typically very small. In some embodiments the average thickness of deposited layer in one iALD cycle is less than about 5 Å, such as between about 0.5-2 Å. Typically several iALD cycles are performed until the desired thickness of the layer is achieved. In operation 209, it is decided if further deposition is required. The decision can be based on the known target thickness of the film, and known thickness deposited in each cycle. If the desired thickness is not reached, operations 201-209 are repeated as many times as necessary to provide the desired thickness. If the desired thickness is reached, the process is complete. In many embodiments, each deposition process includes between about 10-40 iALD cycles, such as between about 15-30 iALD cycles, where each cycle includes operations 201-209. In some embodiments the deposited film may be optionally subjected to a post-treatment, such as a plasma post-treatment in an inert gas (e.g., helium or argon). Post-treatment may be performed in each iALD cycle after deposition of each sublayer, or after several iALD cycles, e.g., after the complete film has been deposited.

It is noted that it is highly advantageous to deposit provided films using iALD as described above, rather than to deposit and plasma treat a large amount of aluminum-containing compound in one step. One of the advantages of using several iALD cycles is significantly decreased damage to the dielectric compared to one-step deposition and treatment. If a bulk amount of aluminum-containing compound is deposited and plasma treated, the continuous prolonged plasma treatment causes densification of dielectric, which is associated with an undesired increased of a dielectric constant of the ILD layer. In contrast, when plasma treatment is performed over several iALD cycles, little or no densification of exposed ILD layer is observed. Furthermore, iALD is particularly advantageous for depositing dielectric aluminum-containing layers on patterned substrates having recessed features because, iALD provides conformal films with excellent coverage of sidewalls as well as horizontal surfaces that cannot be achieved by bulk deposition of TMA followed by a single plasma treatment.

Films can be deposited to a variety of thicknesses. In some embodiments, the thicknesses are in the range of between about 10-100 Å. It is noted that the desired thickness of the film depends on the application and on the properties of the film. Films with relatively high densities, and, consequently with high etch selectivities, may be used as thinner etch stop layers in comparison with films having lower densities and lower etch selectivities (which would require greater thickness to perform their function).

At the same time, films with lower dielectric constants can be deposited to a greater thickness (if desired) relative to films with higher dielectric constants, because they would not drive up the capacitance of the ILD stack, as much as films with higher k. This concept is illustrated by the relationship for the film capacitance (Cox) shown in equation (1):

$$Cox = (\in \times k \times A)/d \quad (1),$$

where $\in$ is the permittivity of free space; k is the dielectric constant of the film; A is the measured area; and d is the thickness of the film.

Figure 3:
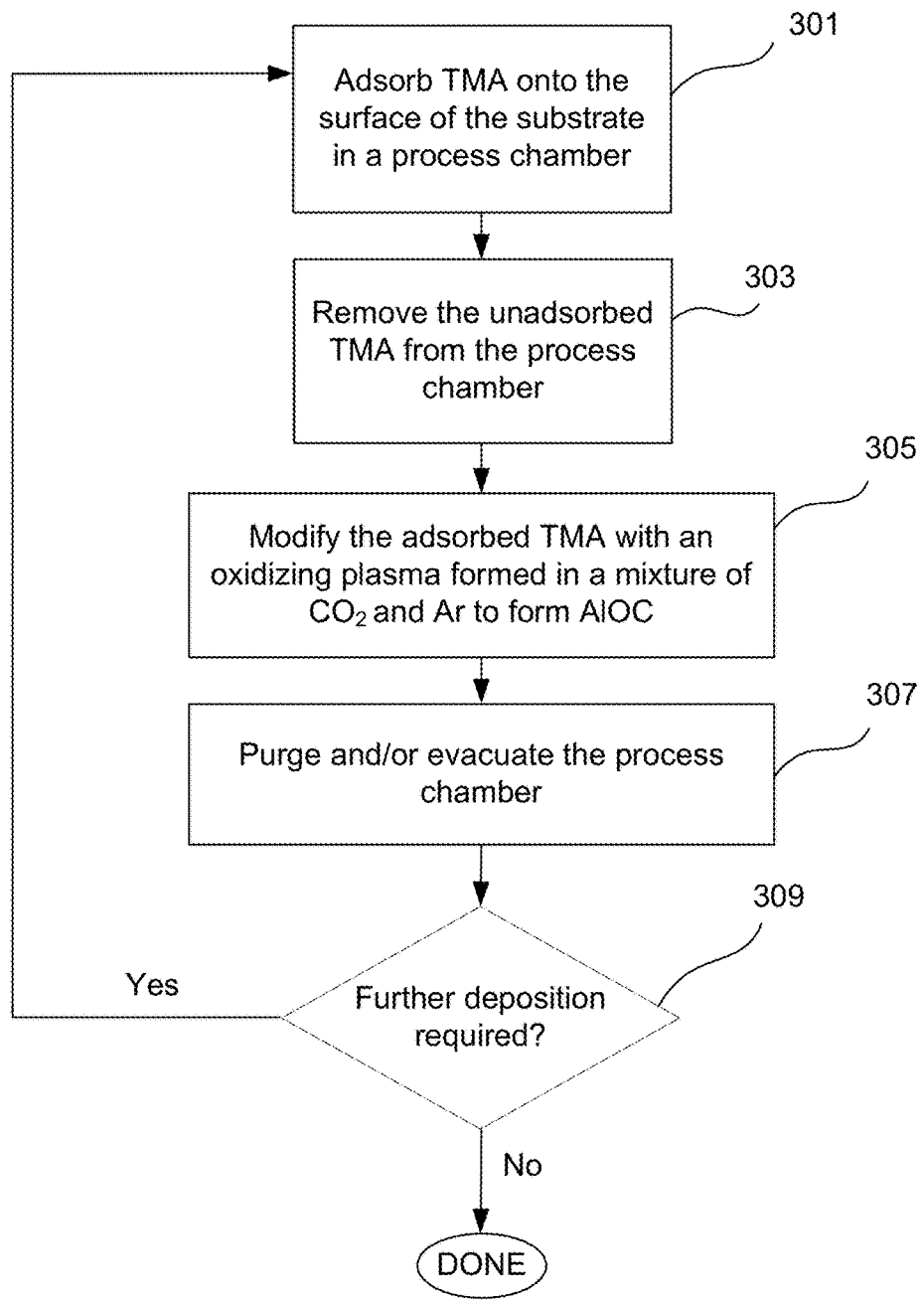
FIG. 3 is a process flow diagram for a method of depositing a dielectric low-k AlOC film according to an embodiment provided herein.

It was discovered that dielectric constant of the film is lowered when more carbon is incorporated into the film (such as more than about 5 atomic % carbon, e.g., 5-10 atomic % carbon). It was also unexpectedly discovered that AlOC films with low dielectric constant and with high incorporation of carbon are formed when argon is used instead of helium during $CO_2$ plasma conversion step. For example treatment with $CO_2$ and argon in a plasma led to AlOC films with dielectric constants of 6.5 or less, such as 5.5. or less, for example 4.9-5.5. The densities of such films were about 2.7-3.2 g/cm$^3$, making them particularly attractive as etch stop materials. A specific example of this process is illustrated by the process flow diagram shown in FIG. 3.

The process starts in 301 by adsorbing TMA on the surface of the substrate. Next, the unadsorbed TMA is removed from the process chamber in 303, e.g., by purging. Next, the adsorbed TMA is converted into an AlOC layer in operation 305. This conversion step involves flowing a process gas comprising argon and $CO_2$ into the process chamber and forming a plasma. In some embodiments, the process gas consists essentially of argon and $CO_2$. In some embodiments the flow rate ratio between $CO_2$ and argon flow rates is between about 0.1-2. Other process conditions may be the same as listed with reference to the process flow diagram of FIG. 2. Suitable ranges of process parameters according to some embodiments are provided in Table 1. After deposition of an AlOC sublayer the process chamber is purged and/or evacuated in 305, and then it is determined in 307, if further deposition is required, and in 309 the operations 301-305 are repeated as many times as necessary to deposit the AlOC film to a desired thickness.

TABLE 1

Illustrative process conditions for deposition of AlOC films.

| Process Parameter | Range |
| --- | --- |
| Temperature (adsorption and conversion) | 300-400° C. |
| Pressure (adsorption and conversion) | 1-10 Torr |
| TMA/N$_2$ mixture flow rate (adsorption step) | 100-2,000 sccm |
| Argon flow rate (conversion step) | 100-20,000 sccm |
| CO$_2$ flow rate (conversion step) | 100-20,000 sccm |
| HF plasma power (conversion step) | 400-3,000 W |
| LF plasma power (conversion step) | 0-2,000 W |

Flow rates and power values are given for a process chamber housing four 300 mm wafers. It is understood, that those skilled in the art can scale these parameters to suit a process chamber of a desired size. 13.56 MHz was used as a frequency for HF plasma, and 400 kHz was used as a frequency for LF plasma.

It is noted that when conversion is performed using a plasma formed in $CO_2$/argon mixture, AlOC films with carbon content of greater than 5% atomic are typically formed. In some embodiments these films have dielectric constants of less than 6.5 and densities of greater than 2.7 g/cm$^3$. When conversion is performed using a plasma formed in $CO_2$/helium mixture, AlOC films with lower carbon content (less than about 5% atomic) or AlO films are formed. In some embodiments these films are characterized by higher dielectric constants than the films formed using $CO_2$/argon plasma, but are still suitable for many applications. Examples of such films include films with dielectric constants of between about 8-10, and densities of between about 2.7-3.2.

Experimental

1. Comparison of Provided AlOC Films to Conventional Aluminum-Containing Dielectric Films.

Two families of AlOC films were prepared according to iALD embodiments provided herein using TMA in the adsorption step and $CO_2$/helium or $CO_2$/argon in the conversion step. The films were compared to a conventional PECVD AlN film and to a conventional PVD Al$_2$O$_3$ film. Table 2 lists data for deposition temperature, leakage current, breakdown voltage, dielectric constant, and density of the films.

TABLE 2

Comparison of AlOC films to conventional films.

| Parameter | PECVD AlN (comparative example) | PVD Al$_2$O$_3$ (comparative example) | AlOC film (CO$_2$/helium conversion) | AlOC film (CO$_2$/argon conversion) |
|---|---|---|---|---|
| Deposition temperature, °C. | <400 | 350 | 350 | 350 |
| Leakage Current (@2MV/cm), Amp/cm$^2$ | $10^{-6}$ | $10^{-8}$ | $9 \cdot 10^{-9}$ | $7 \cdot 10^{-9}$-$9 \cdot 10^{-9}$ |
| Breakdown Voltage, MV/cm | ~-5 | ~-11.5 | ~-10 | ~-11 |
| k | 8.5 | 7.0-8.0 | 8.4-8.6 | 6.4-6.9 |
| Density, g/cm$^3$ | | 3.2 | 3.1 | 2.5-3.0 |

It can be seen that provided films do not require deposition at temperatures of greater than 400° C., are characterized by smaller leakage current than comparative films, and are also characterized by high breakdown voltage (better than AlN, and comparable to Al$_2$O$_3$). The dielectric constants of provided films are comparable to or lower than (in the case of CO$_2$/argon AlOC film) the dielectric constants of comparative films.

2. Properties of AlOC Films.

A number of different AlOC films were prepared with variations in the conversion step. Table 3 lists properties of provided films.

TABLE 3

Properties of AlOC films

| Film ID number | k | Density (g/cm$^3$) | Al/N/O/C/H/Ar, atomic % |
|---|---|---|---|
| 1 | 8.5 | 3.10 | 38.6/0/59.9/0/1.5/0 |
| 2 | 6.9 | 2.73 | 26.7/0/57.8/10/4.5/1 |
| 3 | 6.07 | | |
| 4 | 6.82 | | |
| 5 | 6.39 | 2.7 | 26/0/56.4/6.8/10/0.8 |
| 6 | 5.95 | | |
| 7 | 5.64 | 2.5 | 26.5/0/59.3/5.2/8/1 |
| 8 | 5.39 | | |
| 9 | 4.94 | 2.95 | 30.8/0/55.2/6/7.6/0.4 |
| 10 | 5.30 | | |
| 11 | 4.94 | 2.99 | 36.4/0/56.6/6/0/1 |
| 12 | 4.98 | | |

Twelve AlOC films were deposited by iALD on a planar substrate containing exposed ULK and Cu. Density, dielectric constant, and elemental composition of the films were determined. The dielectric constant was measured on deposited films using capacitance-voltage (CV) measurement with a mercury probe. Elemental analysis was carried out using Rutherford backscattering spectrometry (RBS) for all elements but hydrogen, and with hydrogen forward scattering spectrometry (HFS) for hydrogen.

All films were deposited in an iALD apparatus at a temperature of 350° C. and at a pressure of 2.5 Torr. The films were deposited to a thickness of 10-50 Å using 10-50 iALD cycles as described herein. The adsorption step was carried using TMA provided in a mixture with an N$_2$ carrier gas for all twelve films. Conditions of the conversion step were varied. Film 1 was deposited using CO$_2$/He process gas, where the conversion step was carried out for 0.5 seconds, helium was flowed at 2,000 sccm, HF plasma was provided at a power of 2,000 W, and LF plasma was provided at a power of 1,000 W. Film 2 was deposited using CO$_2$/Ar process gas, where the conversion step was carried out for 0.5 seconds, argon was flowed at 2,000 sccm, HF plasma was provided at a power of 2,000 W, and LF plasma was provided at a power of 1,000 W. Film 3 was deposited using CO$_2$/Ar process gas, where the conversion step was carried out for 5 seconds, argon was flowed at 4,000 sccm, HF plasma was provided at a power of 2,000 W, and LF plasma was provided at a power of 1,000 W. Film 4 was deposited using CO$_2$/Ar process gas, where the conversion step was carried out for 0.5 seconds, argon was flowed at 4,000 sccm, HF plasma was provided at a power of 2,000 W, and LF plasma was provided at a power of 1,000 W. Film 5 was deposited using CO$_2$/Ar process gas, where the conversion step was carried out for 0.5 seconds, argon was flowed at 8,000 sccm, HF plasma was provided at a power of 2,000 W, and LF plasma was provided at a power of 1,000 W. Film 6 was deposited using CO$_2$/Ar process gas, where the conversion step was carried out for 5 seconds, argon was flowed at 8,000 sccm, HF plasma was provided at a power of 2,000 W, and LF plasma was provided at a power of 1,000 W. Film 7 was deposited using CO$_2$/Ar process gas, where the conversion step was carried out for 5 seconds, argon was flowed at 8,000 sccm, HF plasma was provided at a power of 1,000 W, and LF plasma was provided at a power of 500 W. Film 8 was deposited using CO$_2$/Ar process gas, where the conversion step was carried out for 0.5 seconds, argon was flowed at 8,000 sccm, HF plasma was provided at a power of 1,000 W, and no LF plasma was provided. Film 9 was deposited using CO$_2$/Ar process gas, where the conversion step was carried out for 0.5 seconds, argon was flowed at 8,000 sccm, HF plasma was provided at a power of 1,000 W, and LF plasma was provided at a power of 500 W. Film 10 was deposited using CO$_2$/Ar process gas, where the conversion step was carried out for 0.5 seconds, argon was flowed at 8,000 sccm, HF plasma was provided at a power of 2,000 W, and LF plasma was not provided. Film 11 was deposited using CO$_2$/Ar process gas, where the conversion step was carried out for 5 seconds, argon was flowed at 8,000 sccm, HF plasma was provided at a power of 1,000 W, and LF plasma was not provided. Film 12 was deposited using CO$_2$/Ar process gas, where the conversion step was carried out for 5 seconds, argon was flowed at 8,000 sccm, HF plasma was provided at a power of 2,000 W, and LF plasma was not provided. For all films CO$_2$ was flowed during the conversion step at a flow rate of 2000 sccm, HF plasma was generated at 13.56 MHz and LF plasma was generated at 400 kHz (when used). The flow rates and power levels refer to the process chamber housing four 300-mm wafers.

It can be seen by comparing films 1 and 2 that exchange of helium for argon in the conversion step results in a significant reduction in a dielectric constant and in increased incorporation of carbon into the film. It is noted that while carbon is not detected in film 1 by XPS, carbonyl bonding in such films can be detected by more sensitive FTIR, and such films can be viewed as low-carbon AlOC films (e.g., with carbon content of between about 0.5-5% atomic) or as AlO films.

3. Densities of AlON, AlOC, and AlO Films.

Figure 4:
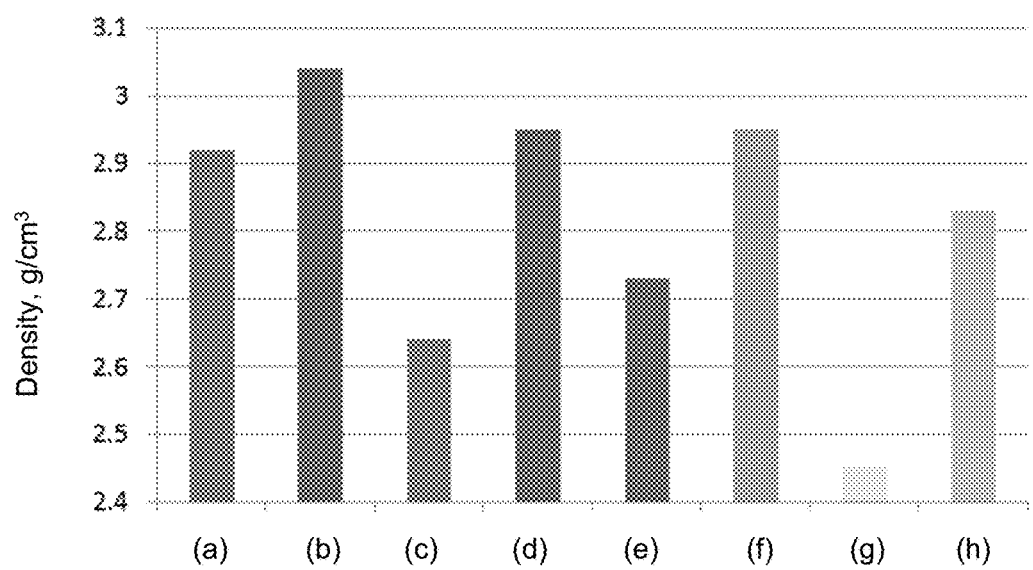
FIG. 4 is an experimental bar graph illustrating densities of different AlO, AlOC, and AlON films deposited according to embodiments provided herein.

A number of films were prepared with variations in the conversion step and/or in a post-treatment step. Densities of films were measured and are provided in the bar graph shown in FIG. 4. All films were deposited in an iALD apparatus at a temperature of 350° C. and at a pressure of 2.5 Torr, with the exception of film (b), which was deposited at 400° C. The films were deposited to a thickness of 10-50 Å using 10-50 iALD cycles as described herein. The adsorption step was carried using TMA provided in a mixture with an $N_2$ carrier gas for all films. The process conditions for the conversion step and/or post-treatment were varied. Film (a) was an AlON film deposited using $N_2O/He$ conversion process gas, where the plasma conversion step was carried out for 10 seconds, and no post-treatment was performed. Film (b) was an AlO or low-carbon AlOC film deposited using $CO_2/He$ conversion process gas, where the conversion was carried out for 1 second at 350° C. and no post-treatment was performed. Film (c) was an AlO or low-carbon AlOC film deposited using $CO_2/He$ conversion process gas, where the conversion was carried out for 10 seconds and no post-treatment was performed. Film (d) was an AlO or low-carbon AlOC film deposited using $CO_2/He$ conversion process gas, where helium was provided at a flow rate of 10 slm during conversion, and no post-treatment was performed. Film (e) was an AlOC film deposited using $CO_2/Ar$ conversion process gas, where no post-treatment was performed. Film (f) was an AlOC or AlO film deposited using $CO_2/He$ conversion process gas, where post-treatment with argon plasma was performed on the entire deposited film for 10 seconds. Film (g) was an AlOC or AlO film deposited using $CO_2/He$ conversion process gas, where post-treatment with helium plasma was performed for 10 seconds after the entire film has been deposited. Film (h) was a film deposited using $CO_2/He$ conversion process gas, where plasma post-treatment with $N_2$ was performed for 10 seconds after the film has been deposited.

It can be seen that all films with the exception of film (g) have densities of greater than 2.5 g/cm$^3$. A number of films with densities of greater than 2.8 g/cm$^3$ are provided.

4. Correlation Between Density and Dielectric Constant.

Figure 5:
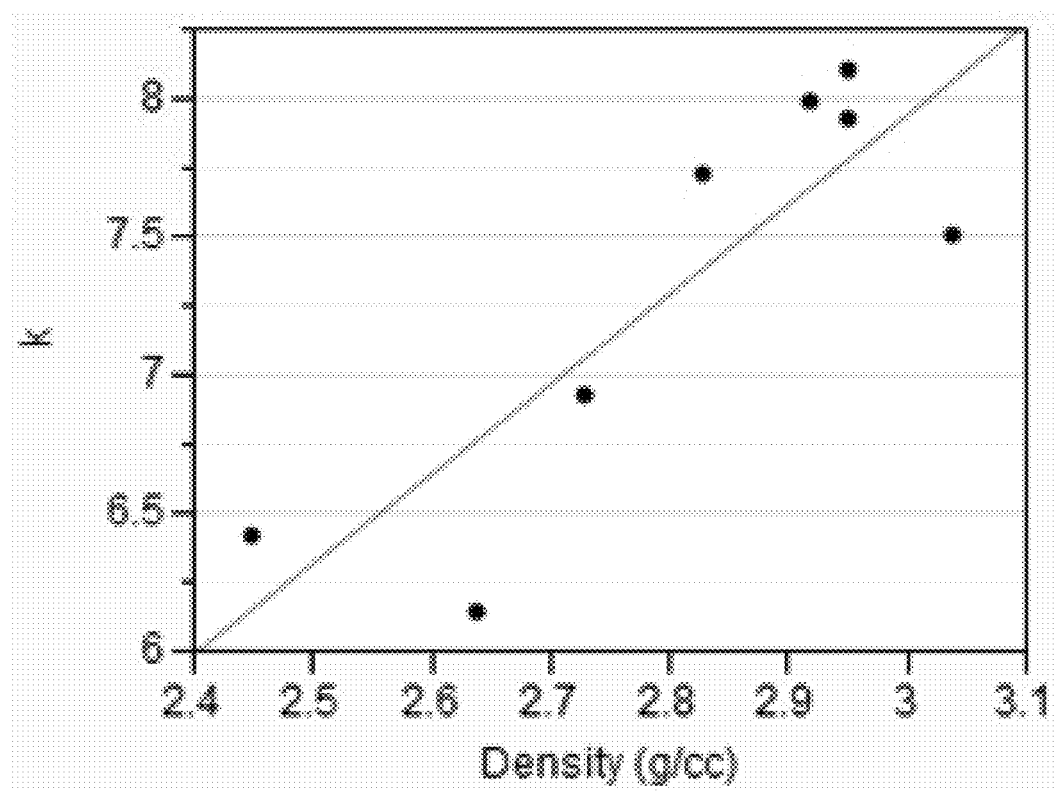
FIG. 5 is an experimental plot illustrating a relationship between film density and dielectric constant for films prepared according to embodiments provided herein.

FIG. 5 provides an experimental plot illustrating correlation between dielectric constant and density for a number of films deposited according to embodiments provided herein. It can be seen that there is a negative correlation between these parameters in the k range of between 6 and 8.

5. Correlation Between Density and Leakage Current.

Figure 6:
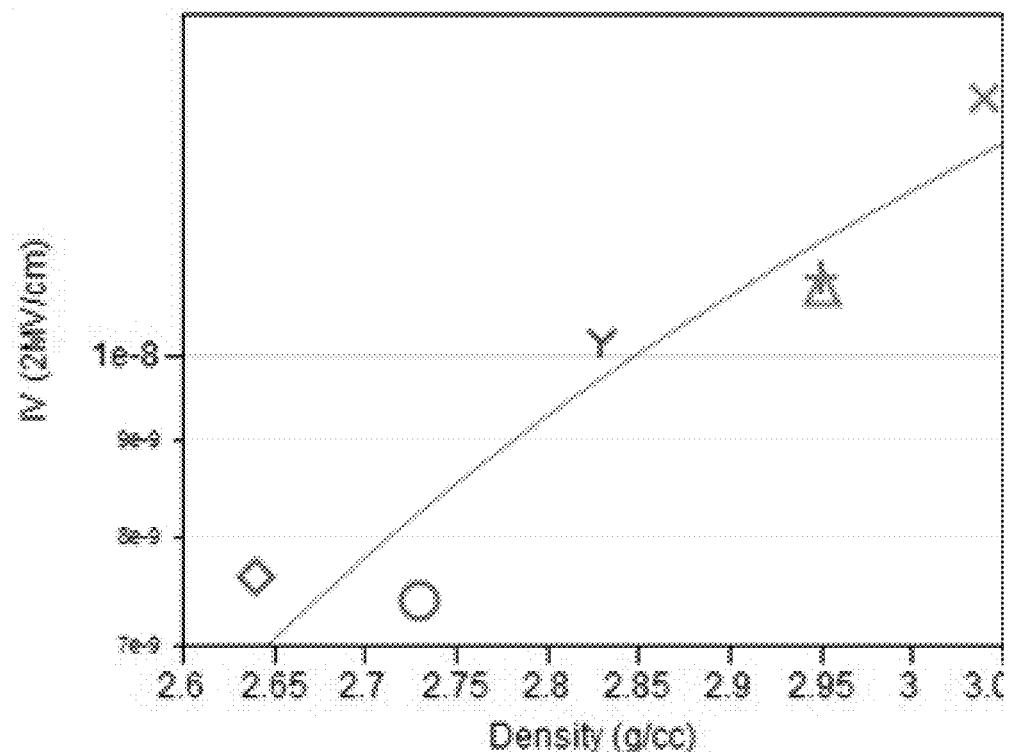
FIG. 6 is an experimental plot illustrating a relationship between breakdown voltage and density for films prepared according to embodiments provided herein.

FIG. 6 provides an experimental plot illustrating correlation between leakage current and density for a number of films deposited according to embodiments provided herein. It can be seen that there is a negative correlation between these parameters.

6. FTIR Spectra of AlOC Films

Figure 7A:
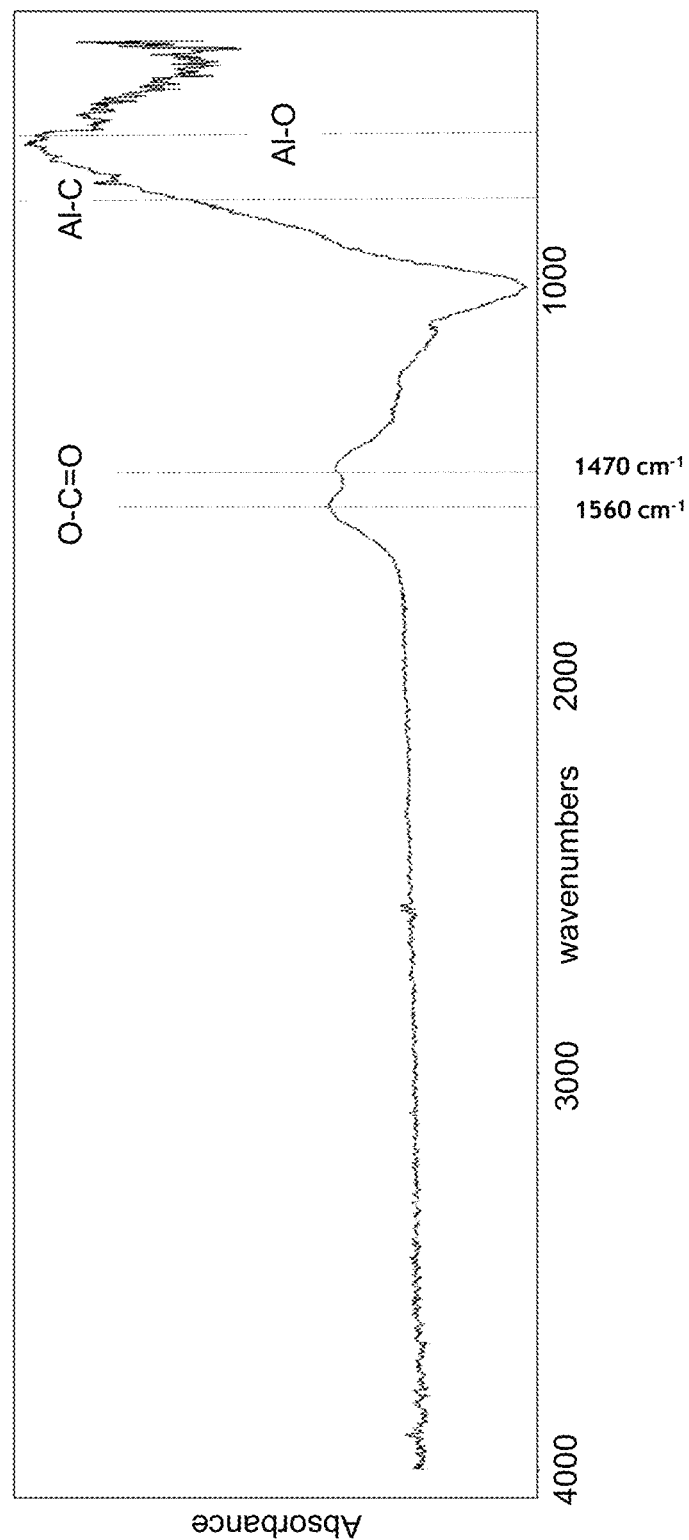
FIG. 7A is an FTIR spectrum of an AlOC film prepared using $CO_2$ and helium plasma treatment of an adsorbed TMA layer.
Figure 7B:
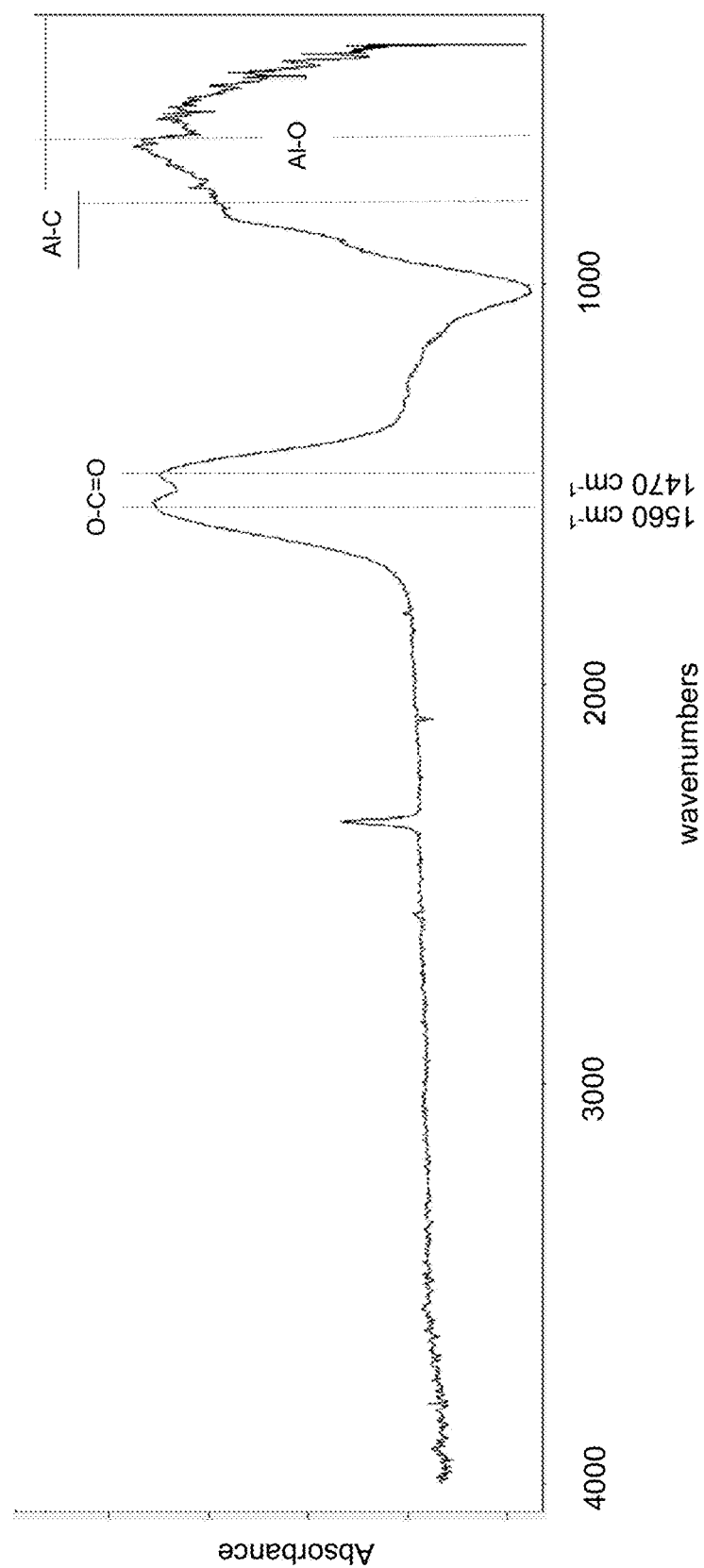
FIG. 7B is an FTIR spectrum of an AlOC film prepared using $CO_2$ and argon plasma treatment of an adsorbed TMA layer.
Figure 7C:
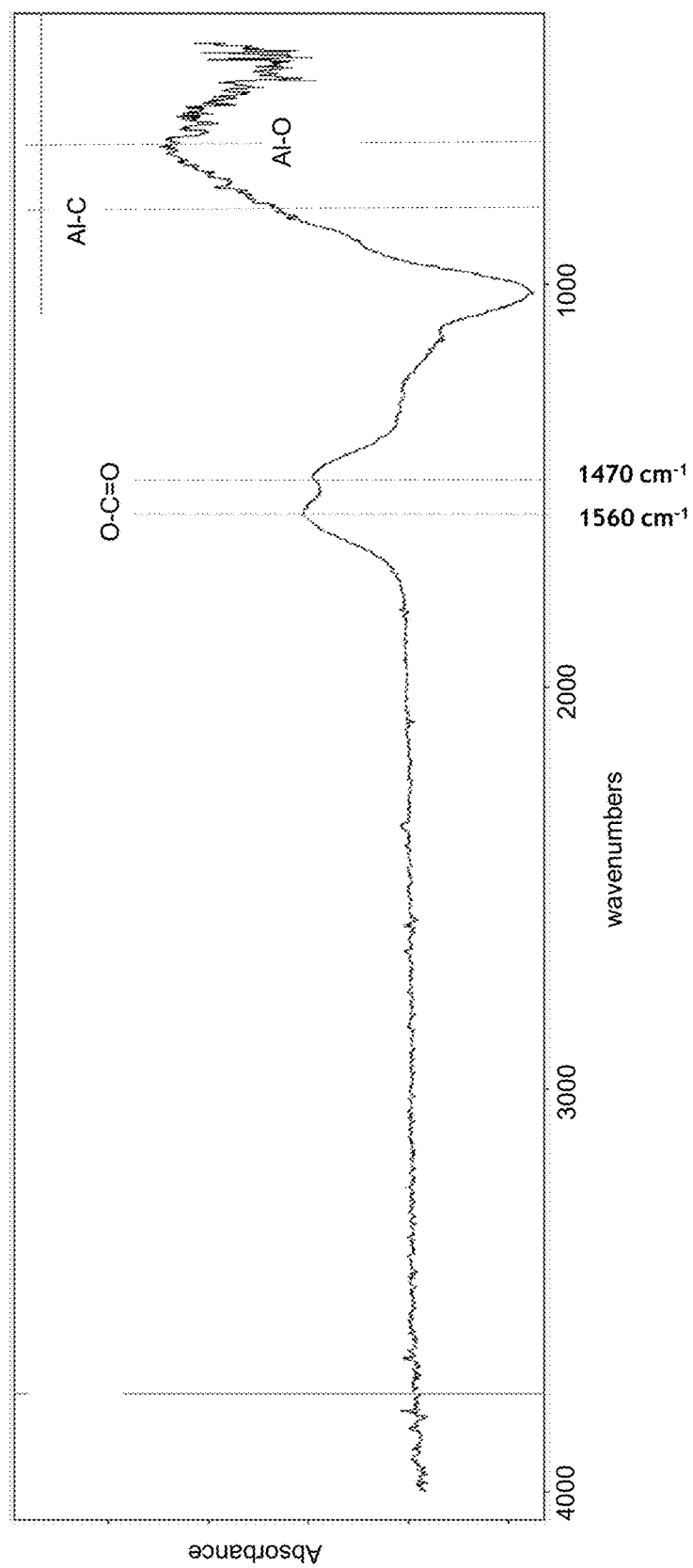
FIG. 7C is an FTIR spectrum of another AlOC film prepared using $CO_2$ and argon plasma treatment of an adsorbed TMA layer.
Figure 8:
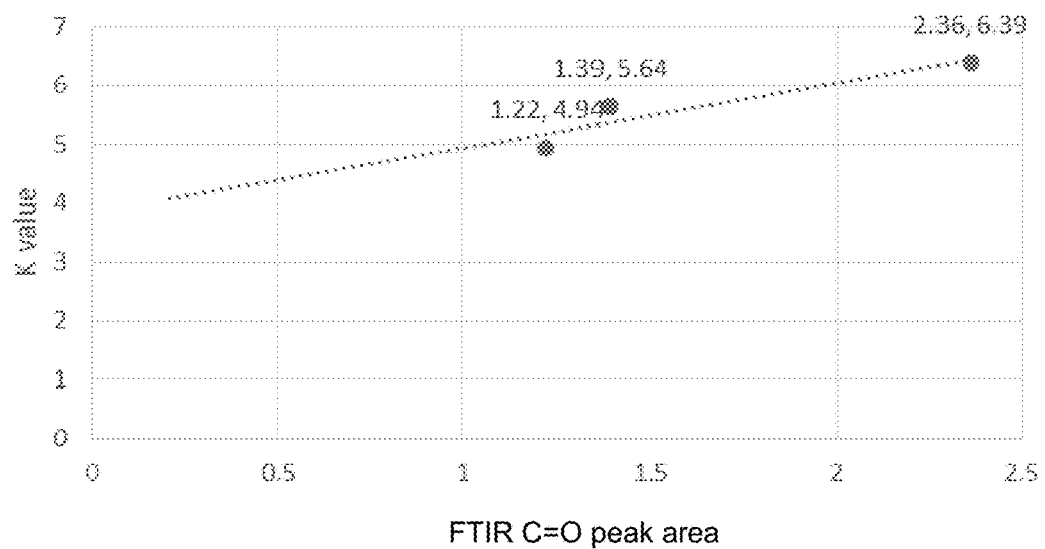
FIG. 8 is an experimental plot illustrating a relationship between dielectric constants and areas of FTIR C=O peak for different AlOC films prepared according to embodiments provided herein.

FTIR spectra for AlOC films deposited using $CO_2/He$ (FIG. 7A), and $CO_2/Ar$ (FIGS. 7B and 7C) conversion chemistries were recorded. FIG. 7B provides an FTIR spectrum of an AlOC film having a dielectric constant of 6.9, while FIG. 7C provides an FTIR spectrum of an AlOC film having a dielectric constant of 4.94. It can be seen that all three spectra exhibit peaks at 1560 and 1470 cm$^{-1}$ corresponding to a carbonyl stretch, where the C=O peak is more pronounced in the film prepared using $CO_2/Ar$ conversion. Shoulders at 870 cm$^{-1}$ corresponding to Al—C can also be observed. FIG. 8 is a plot illustrating correlation between the area of a carbonyl stretch peak on the FTIR spectra for different AlOC films prepared using $CO_2/Ar$ conversion gas and the films' dielectric constant. It can be seen that the dielectric constant increases with the FTIR C=O peak area. It is also believed that a decrease in the intensity of an Al—O peak is associated with a decrease in the dielectric constant.

7. Carbon Depletion of Underlying Layers.

It is known that during oxidative plasma depositions and treatments, the underlying layers of the substrate may be damaged. Specifically, carbon-containing layers such as ODC may be depleted of carbon due to oxidation. The ability of provided $N_2O/He$, $CO_2/He$ and $CO_2/Ar$ conversion steps to cause such damage was explored using time of flight secondary mass spectrometry (TOF SIMS). A substrate containing an exposed ODC layer was subjected to iALD deposition using TMA in the conversion step and $N_2O/He$, $CO_2/He$ or $CO_2/Ar$ chemistry in the plasma conversion step. The resulting substrates were tested for the presence of different elements at different depths using TOF SIMS. Only $N_2O/He$ chemistry exhibited appreciable depletion of carbon in the ODC layer, where carbon was depleted for the depth of 75 Å. $CO_2/He$ and $CO_2/Ar$ chemistries did not cause any significant depletion of carbon in the ODC layer. This result suggests that $CO_2$ should be the preferred oxidative species in the plasma conversion, particularly when deposition is performed on carbon-containing dielectrics.

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. Hardware for accomplishing the process operations includes iALD processing chambers and PECVD processing chambers. In some embodiments all operations of provided methods are performed in a single process chamber. In other implementations the substrate may be transferred from chamber to chamber to perform different steps of the method. The system controller will typically include one or more memory devices and one or more processors configured to execute the instructions so that the apparatus will perform a method in accordance with the disclosed implementations. Machine-readable media containing instructions for controlling process operations in accordance with the disclosed implementations may be coupled to the system controller.

In some embodiments the deposition is conducted in an iALD reactor which is a part of a Vector Excel deposition module available from Lam Research Corp. of Fremont, Calif. A suitable process chamber includes a support for holding the wafer substrate during deposition (wafer pedestal), a generator for forming plasma in the process chamber, and conduits for delivering the aluminum-containing precursor and conversion process gases ($CO_2$, argon, helium, etc.) to the process chamber. The apparatus is further configured for purging and/or evacuating the process chamber, and for maintaining a desired pressure and temperature in the process chamber during deposition.

Examples of iALD process chambers are described in U.S. Pat. No. 6,416,822, U.S. Pat. No. 6,428,859, and U.S. Pat. No. 8,747,964 which are herein incorporated by reference in their entireties.

Figure 9:
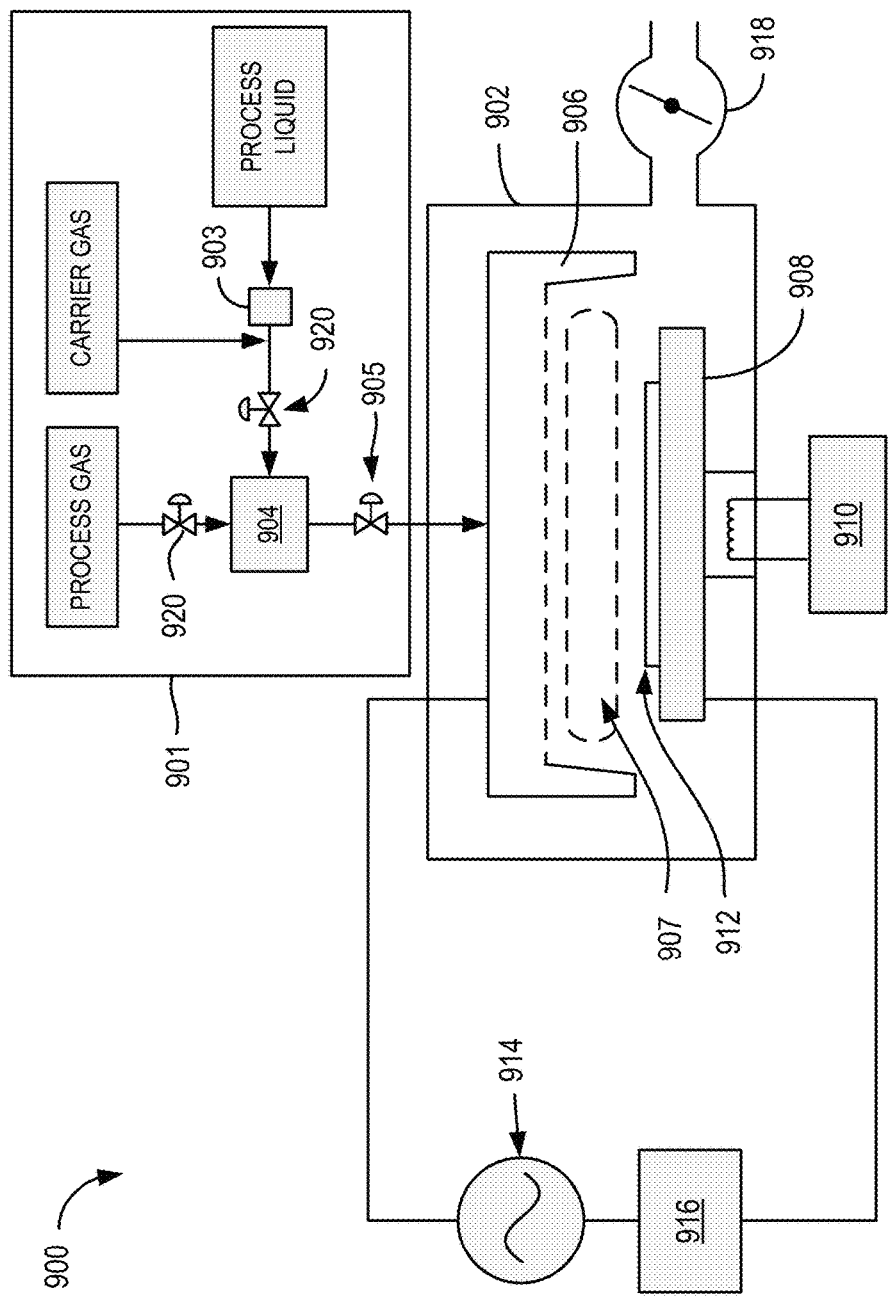
FIG. 9 is a schematic presentation of an iALD process station that can be used for deposition of low-k films according to an embodiment provided herein.

FIG. 9 schematically shows an embodiment of a process station 900 that may be used to deposit provided films using atomic layer deposition iALD. For simplicity, the process station 900 is depicted as a standalone process station having a process chamber body 902 for maintaining a low-pressure environment. However, it will be appreciated that a plurality of process stations 900 may be included in a common process tool environment. Further, it will be appreciated that, in some embodiments, one or more hardware parameters of process station 900, including those discussed in detail below, may be adjusted programmatically by one or more computer controllers.

Process station 900 fluidly communicates with reactant delivery system 901 for delivering process gases to a distribution showerhead 906. Reactant delivery system 901 includes a mixing vessel 904 for blending and/or conditioning process gases for delivery to showerhead 906. One or more mixing vessel inlet valves 920 may control introduction of process gases to mixing vessel 904. Similarly, a showerhead inlet valve 905 may control introduction of process gasses to the showerhead 906.

Some reactants, like TMA, may be stored in liquid form prior to vaporization at and subsequent delivery to the process station. For example, the embodiment of FIG. 9 includes a vaporization point 903 for vaporizing liquid reactant to be supplied to mixing vessel 904. In some embodiments, vaporization point 903 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 903 may be heat traced. In some examples, mixing vessel 904 may also be heat traced. In one non-limiting example, piping downstream of vaporization point 903 has an increasing temperature profile extending from approximately 100° C. to approximately 150° C. at mixing vessel 904.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 904. In another scenario, a liquid injector may be mounted directly to showerhead 906.

In some embodiments, a liquid flow controller upstream of vaporization point 903 may be provided for controlling a mass flow of liquid for vaporization and delivery to process station 900. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 906 distributes process gases toward substrate 912. In the embodiment shown in FIG. 9, substrate 912 is located beneath showerhead 906, and is shown resting on a pedestal 908. It will be appreciated that showerhead 906 may have any suitable shape, and may have any suitable number and arrangement of ports for distributing processes gases to substrate 912.

In some embodiments, a microvolume 907 is located beneath showerhead 906. Performing an ALD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 908 may be raised or lowered to expose substrate 912 to microvolume 907 and/or to vary a volume of microvolume 907. For example, in a substrate transfer phase, pedestal 908 may be lowered to allow substrate 912 to be loaded onto pedestal 908. During a deposition process phase, pedestal 908 may be raised to position substrate 912 within microvolume 907. In some embodiments, microvolume 907 may completely enclose substrate 912 as well as a portion of pedestal 908 to create a region of high flow impedance during a deposition process.

Optionally, pedestal 908 may be lowered and/or raised during portions the deposition process to modulate process pressure, reactant concentration, etc., within microvolume 907. In one scenario where process chamber body 902 remains at a base pressure during the deposition process, lowering pedestal 908 may allow microvolume 907 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 908 may allow a plasma density to be varied during plasma activation and/or treatment cycles included in the deposition process. At the conclusion of the deposition process phase, pedestal 908 may be lowered during another substrate transfer phase to allow removal of substrate 912 from pedestal 908.

While the example microvolume variations described herein refer to a height-adjustable pedestal, it will be appreciated that, in some embodiments, a position of showerhead 906 may be adjusted relative to pedestal 908 to vary a volume of microvolume 907. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers.

Returning to the embodiment shown in FIG. 9, showerhead 906 and pedestal 908 electrically communicate with RF power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are included above. Likewise, RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 908 may be temperature controlled via heater 910. Further, in some embodiments, pressure control for deposition process station 900 may be provided by butterfly valve 918. As shown in the embodiment of FIG. 9, butterfly valve 918 throttles a vacuum provided by a downstream vacuum pump (not shown). However, in some embodiments, pressure control of process station 900 may also be adjusted by varying a flow rate of one or more gases introduced to process station 900.

Figure 10:
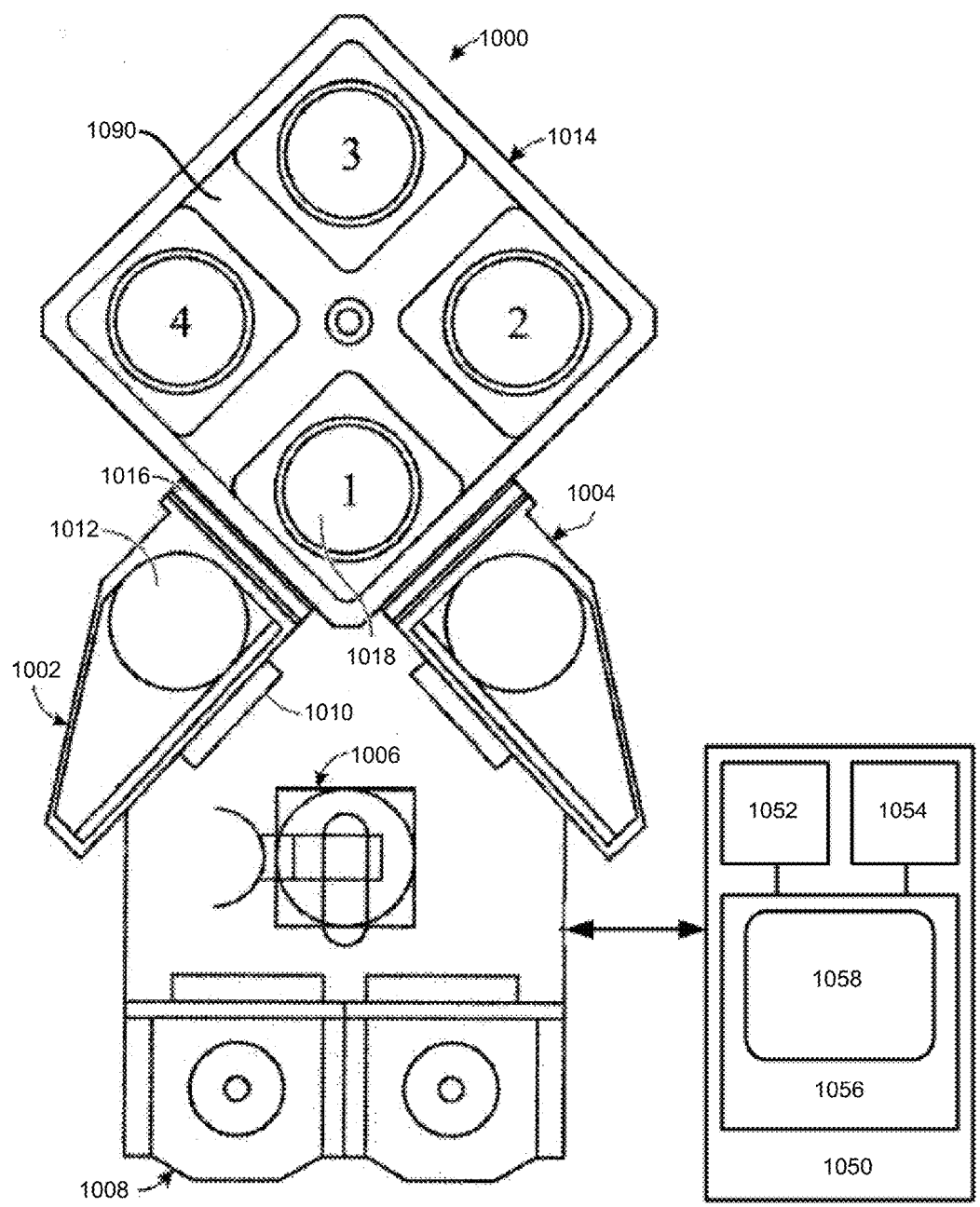
FIG. 10 shows a schematic view of a multi-station processing tool according to an embodiment provided herein.

In some embodiments, the substrates provided herein are processed in a multi-station tool. FIG. 10 shows a schematic view of an embodiment of a multi-station processing tool 1000 with an inbound load lock 1002 and an outbound load lock 1004, either or both of which may comprise a remote plasma source. A robot 1006, at atmospheric pressure, is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 comprises a remote plasma source, the wafer may be exposed to a remote plasma treatment in the load lock prior to being introduced into a processing chamber 1014. Further, the wafer also may be heated in the inbound load lock 1002 as well, for example, to remove moisture and adsorbed gases. Next, a chamber transport port 1016 to processing chamber 1014 is opened, and another robot (not shown) places the wafer into the reactor on a pedestal of a first station shown in the reactor for processing.

The depicted processing chamber 1014 comprises four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. While the depicted processing chamber 1014 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 also depicts an embodiment of a wafer handling system 1090 for transferring wafers within processing chamber 1014. In some embodiments, wafer handling system 1090 may transfer wafers between various process stations and/or between a process station and a load lock. It will be appreciated that any suitable wafer handling system may be employed. Non-limiting examples include wafer carousels and wafer handling robots. FIG. 10 also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 1000. System control software 1058 may be configured in any suitable way. For example, various process tool component subroutines or control objects may be written to control operation of the process tool components necessary to carry out various process tool processes in accordance with the disclosed methods. System control software 1058 may be coded in any suitable computer readable programming language.

In some embodiments, system control software 1058 may include input/output control (IOC) sequencing instructions for controlling the various parameters described above. For example, each phase of an iALD process may include one or more instructions for execution by system controller 1050. The instructions for setting process conditions for an iALD process phase may be included in a corresponding iALD recipe phase. In some embodiments, the iALD recipe phases may be sequentially arranged, so that all instructions for an iALD process phase are executed concurrently with that process phase.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 11:
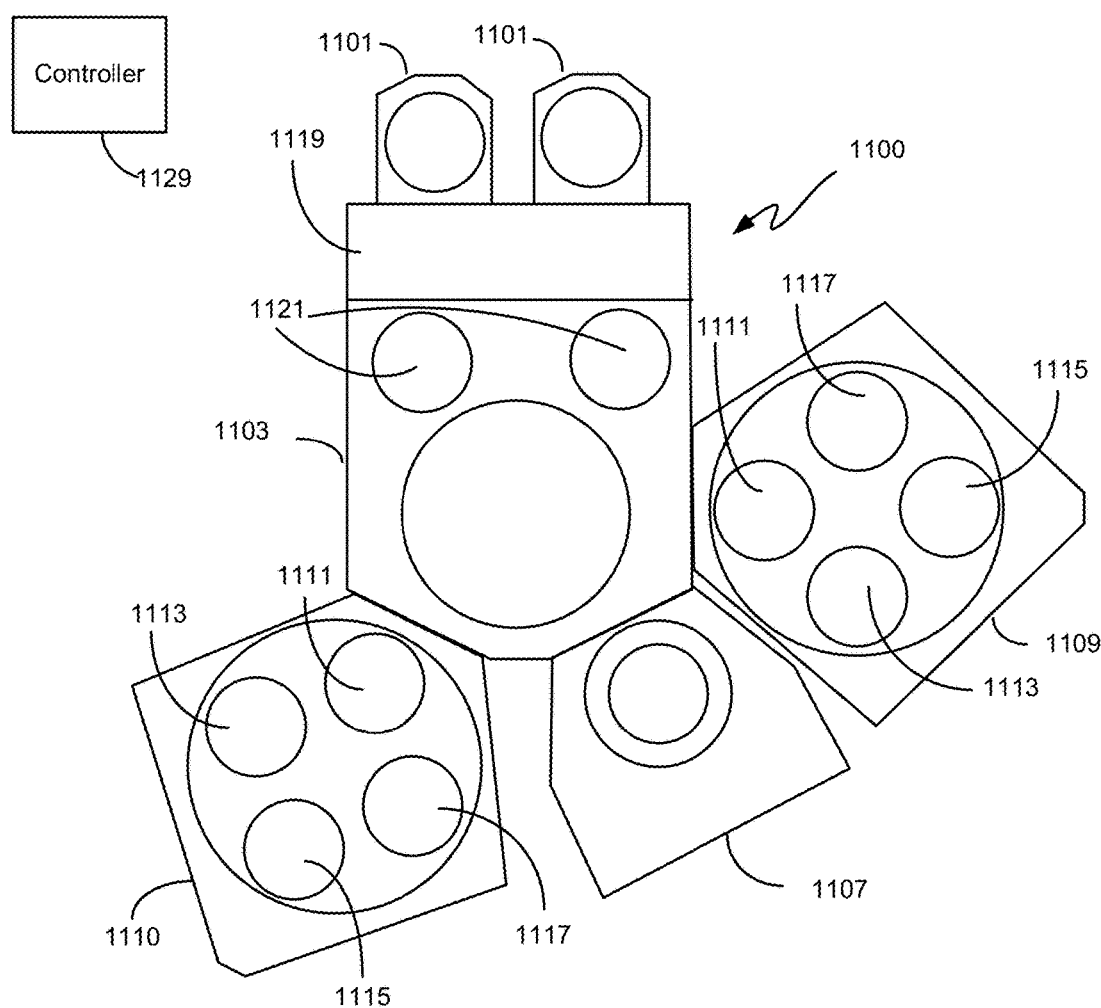
FIG. 11 is a block diagram of a processing tool configured for depositing thin films according to an embodiment provided herein.

FIG. 11 is a block diagram of a processing system suitable for conducting thin film deposition processes in accordance with certain embodiments. The system 1100 includes a transfer module 1103. The transfer module 1103 provides a clean, pressurized environment to minimize risk of contamination of substrates being processed as they are moved between various reactor modules. Mounted on the transfer module 1103 are two multi-station reactors 1109 and 1110, each capable of performing atomic layer deposition (ALD) and/or chemical vapor deposition (CVD) according to certain embodiments. Reactors 1109 and 1110 may include multiple stations 1111, 1113, 1115, and 1117 that may sequentially or non-sequentially perform operations in accordance with disclosed embodiments. The stations may include a heated pedestal or substrate support, one or more gas inlets or showerhead or dispersion plate.

Also mounted on the transfer module 1103 may be one or more single or multi-station modules 1107 capable of performing plasma or chemical (non-plasma) pre-cleans, or any other processes described in relation to the disclosed methods. The module 1107 may in some cases be used for various treatments to, for example, prepare a substrate for a deposition process. The module 1107 may also be designed/configured to perform various other processes such as etching or polishing. The system 1100 also includes one or more wafer source modules 1101, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all of the activities of the deposition apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 1129. The signals for controlling the process are output on the analog and digital output connections of the deposition apparatus 1100.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1129, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. Such processing may be employed, for example, to pattern the dielectric layers on which the tantalum nitride, tantalum, and/or copper layers are deposited, as described above.

Alternative Embodiments

In an alternative embodiment, a method of depositing AlO, AlON, or an AlOC layer involves: (a) depositing an AlN layer; and (b) treating the AlN layer with an oxidizer to form a layer selected from the group consisting of AlO, AlON, or an AlOC. For example the AlN layer may be treated with a plasma formed in a process gas comprising an oxidizer, such as $CO_2$ or $N_2O$. The AlN layer may be deposited by a variety of methods. In some embodiments AlN is deposited by ALD and involves: (i) adsorbing an aluminum-containing compound (e.g., TMA) onto the substrate; (ii) treating the adsorbed layer with a nitrogen-containing compound (e.g., ammonia) to form an AlN layer; and (iii) repeating steps (i) and (ii) as many times as necessary. The process may further include purging and/or evacuating the process chamber after (i) and (ii). In some embodiments the oxidative treatment is performed after deposition of each AlN sublayer.

What is claimed is:

1. A method for forming a semiconductor device structure, the method comprising:
   (a) in a process chamber, contacting a semiconductor substrate with an aluminum-containing compound and adsorbing the aluminum-containing compound onto the semiconductor substrate;
   (b) removing the unadsorbed aluminum-containing compound from the process chamber;
   (c) modifying the adsorbed aluminum-containing compound to form a dielectric compound selected from the group consisting of AlO, AlOC, AlON, and AlOCN by contacting the semiconductor substrate in the process chamber with an oxidizing plasma;
   (d) purging and/or evacuating the process chamber; and
   (e) repeating operations (a)-(d) to form a dielectric film, wherein the formed dielectric film is an etch stop film that is characterized by a dielectric constant of less than about 10, and a density of at least about 2.5 g/cm$^3$.

2. The method of claim 1, wherein the oxidizing plasma is formed in a process gas comprising an inert gas and an oxidizer selected from the group consisting of $CO_2$, $N_2O$, and mixtures thereof.

3. The method of claim 2, wherein the formed dielectric film is the AlOC film, and wherein the aluminum-containing compound used in (a) is trimethylaluminum, and the process gas used in (c) comprises $CO_2$ and argon.

4. The method of claim 3, wherein the AlOC film has a dielectric constant of less than about 6.5 and a density of at least about 2.7 g/cm$^3$.

5. The method of claim 3, wherein the AlOC film contains at least about 5% atomic carbon.

6. The method of claim 3, wherein the AlOC film contains between about 5-10% atomic carbon.

7. The method of claim 3, wherein (c) comprises providing $CO_2$ and argon to the process chamber at a $CO_2$ to argon flow rate ratio of between about 0.1-2.

8. The method of claim 2, wherein the formed dielectric film is the AlOC or the AlO film, and wherein the aluminum-containing compound used in (a) is trimethylaluminum, and the process gas used in (c) comprises $CO_2$ and helium.

9. The method of claim 8, wherein carbon content in the dielectric film is between about 0-5 atomic %.

10. The method of claim 8, wherein the dielectric film has a dielectric constant of between about 8-10, and a density of between about 2.7-3.2 g/cm$^3$.

11. The method of claim 2, wherein the formed dielectric film is the AlON film, and wherein the aluminum-containing compound used in (a) is trimethylaluminum, and the process gas used in (c) comprises $N_2O$.

12. The method of claim 2, wherein (a) and (c) are performed at a temperature range of between about 300-420° C.

13. The method of claim 2, wherein (a) and (c) are performed at a pressure range of between about 1-10 Torr.

14. The method of claim 1, wherein the aluminum-containing compound is trimethylaluminum.

15. The method of claim 1, wherein the method deposits the dielectric film to a thickness of between about 10-100 Å.

16. The method of claim 1, wherein the method deposits the dielectric film onto a planar substrate.

17. The method of claim 1, wherein the method conformally deposits the dielectric film onto a substrate comprising a plurality of recessed features.

18. The method of claim 1, wherein the method deposits the dielectric film onto an exposed layer of dielectric and an exposed layer of metal.

19. The method of claim 1, wherein deposition of the dielectric film comprises performing (a)-(d) 10-40 times.

20. The method of claim 1, further comprising:
   applying photoresist to the semiconductor substrate;
   exposing the photoresist to light;
   patterning the photoresist and transferring the pattern to the semiconductor substrate; and
   selectively removing the photoresist from the semiconductor substrate.

* * * * *